(12) United States Patent
Kitano et al.

(10) Patent No.: US 6,761,125 B2
(45) Date of Patent: Jul. 13, 2004

(54) COATING FILM FORMING SYSTEM

(75) Inventors: Takahiro Kitano, Kumamoto-Ken (JP); Yoshiyuki Kawafuchi, Kumamoto-Ken (JP); Norihisa Koga, Kumamoto-Ken (JP); Toshichika Takei, Kumamoto-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/242,711

(22) Filed: Sep. 13, 2002

(65) Prior Publication Data

US 2003/0056722 A1 Mar. 27, 2003

(30) Foreign Application Priority Data

Sep. 14, 2001 (JP) ........................................ 2001-279547

(51) Int. Cl.[7] .............................................. B05B 15/04
(52) U.S. Cl. ........................ 118/301; 118/504; 118/323
(58) Field of Search ................................ 118/301, 302, 118/326, 323, 504, 505, 305; 396/611

(56) References Cited

U.S. PATENT DOCUMENTS

| | | | |
|---|---|---|---|
| 5,620,370 A | * | 4/1997 | Umai et al. ................. 454/354 |
| 5,826,129 A | * | 10/1998 | Hasebe et al. ............... 396/611 |
| 6,402,400 B1 | * | 6/2002 | Ueda et al. .................. 396/611 |
| 6,416,583 B1 | | 7/2002 | Kitano et al. |
| 2001/0033895 A1 | * | 10/2001 | Minami et al. ............. 427/240 |

* cited by examiner

Primary Examiner—Richard Crispino
Assistant Examiner—Yewebdar Tadesse
(74) Attorney, Agent, or Firm—Oblon, Spivak, McClelland, Maier & Neustadt, P.C.

(57) ABSTRACT

A system for supplying a chemical to a substrate to form a liquid film of the chemical on the substrate. The system includes a plate having a slit between a nozzle portion movable in lateral directions, and a substrate held by a substrate holding portion movable in longitudinal directions. Shock eliminating portions, provided at left and right ends of the slit, inhibit mist from being produced from a coating liquid supplied outside of the slit. A pair of shutters are capable of washing the coating liquid received by the surfaces of the shock eliminating portions. In the vicinity of the slit, a suction port is provided over a range corresponding to a movable region of the nozzle for sucking mist produced when the nozzle is scanned to carry out coating. The plate has a slit for dispersing a downward flow outside of the slit.

29 Claims, 17 Drawing Sheets

F I G. I

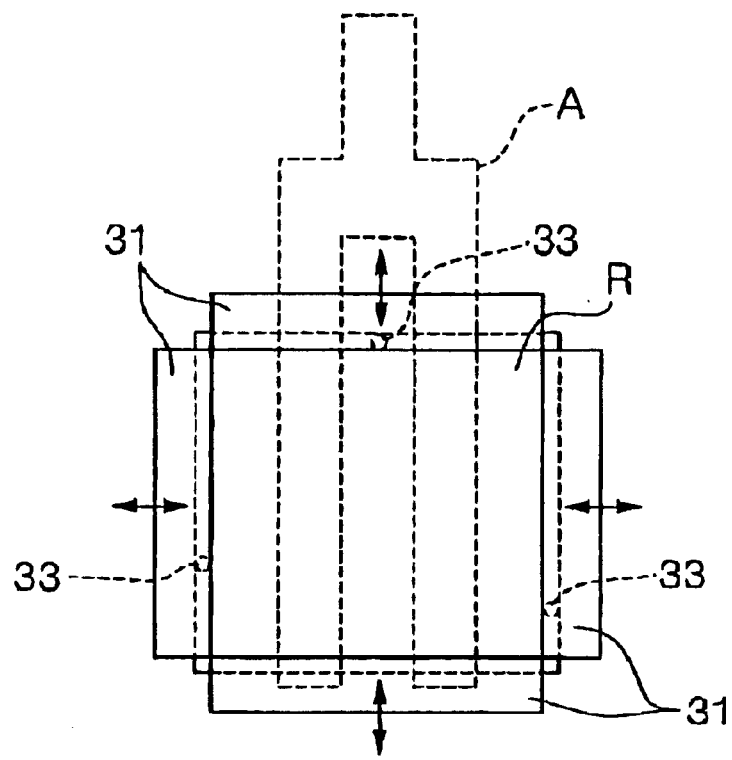
F I G. 4
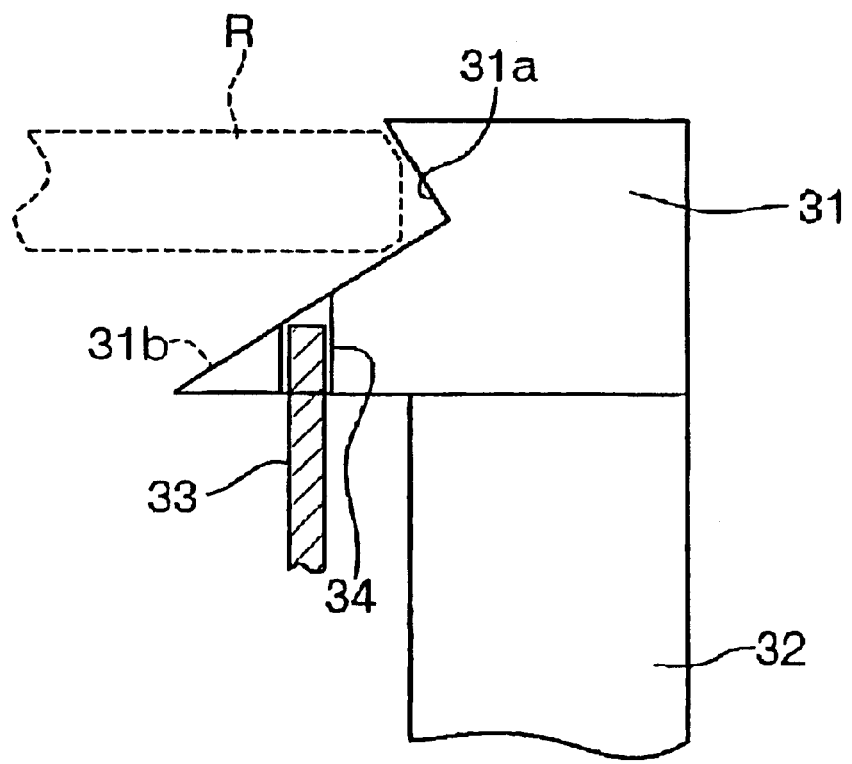
F I G. 5

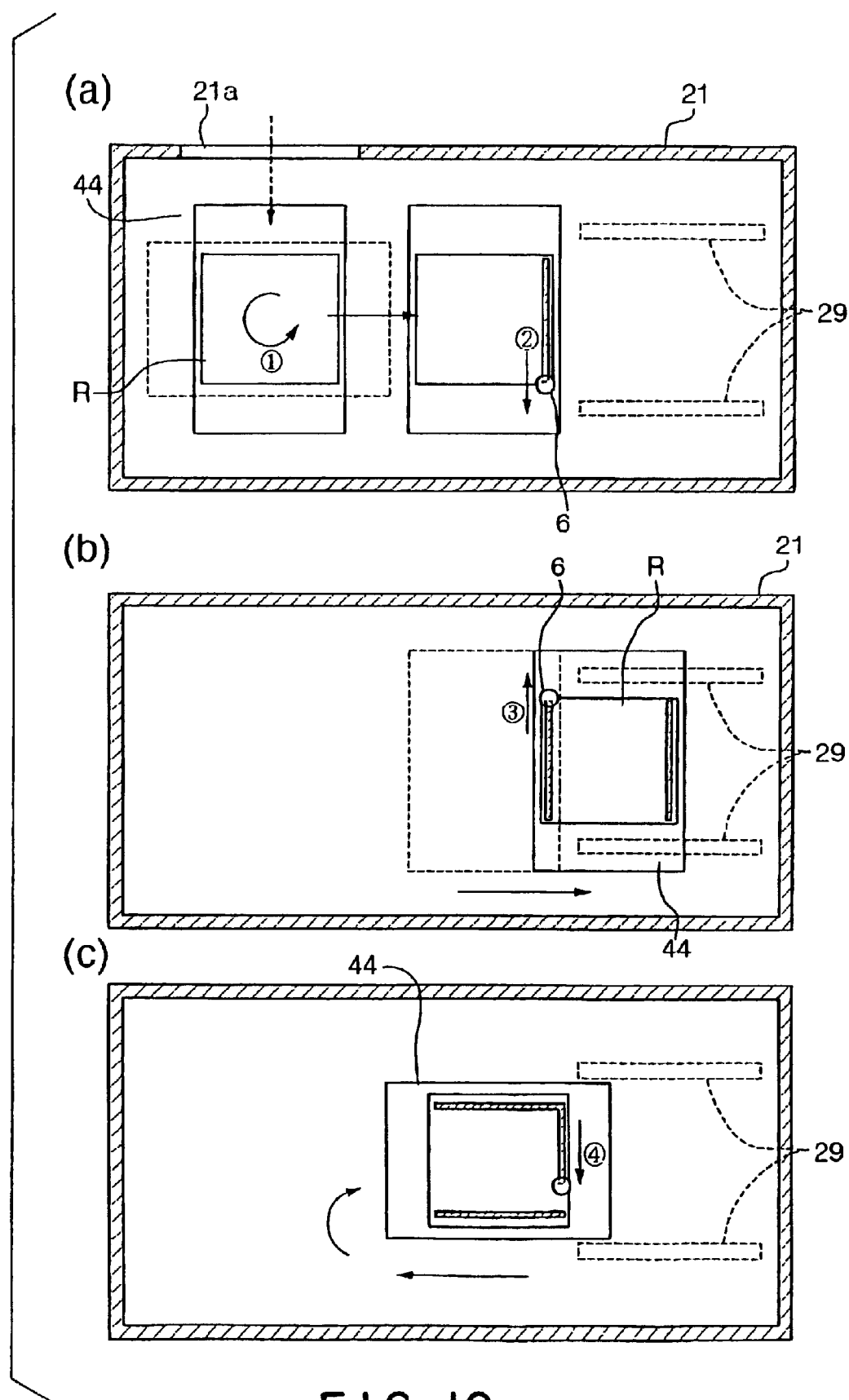
F I G. 10

(a)
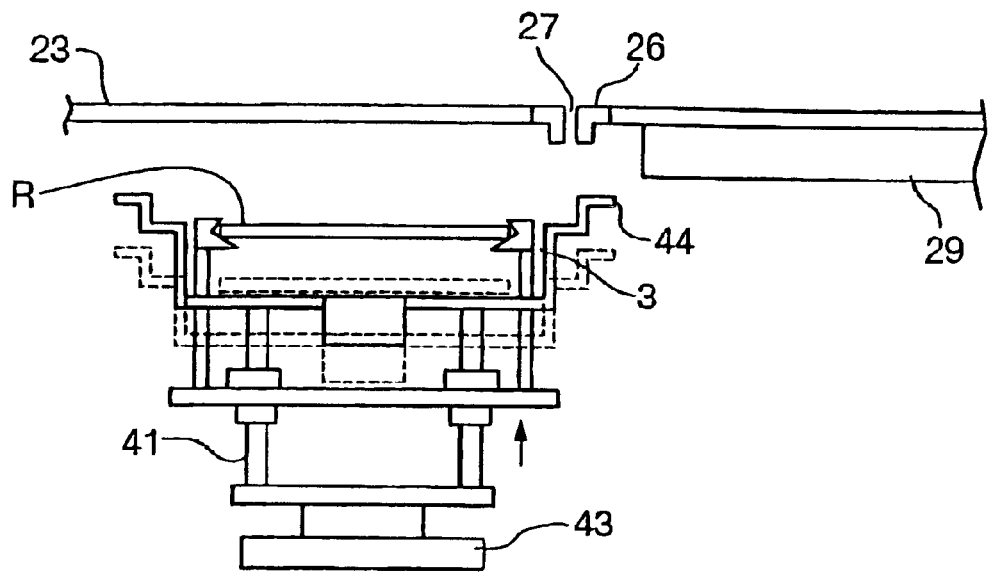
(b)
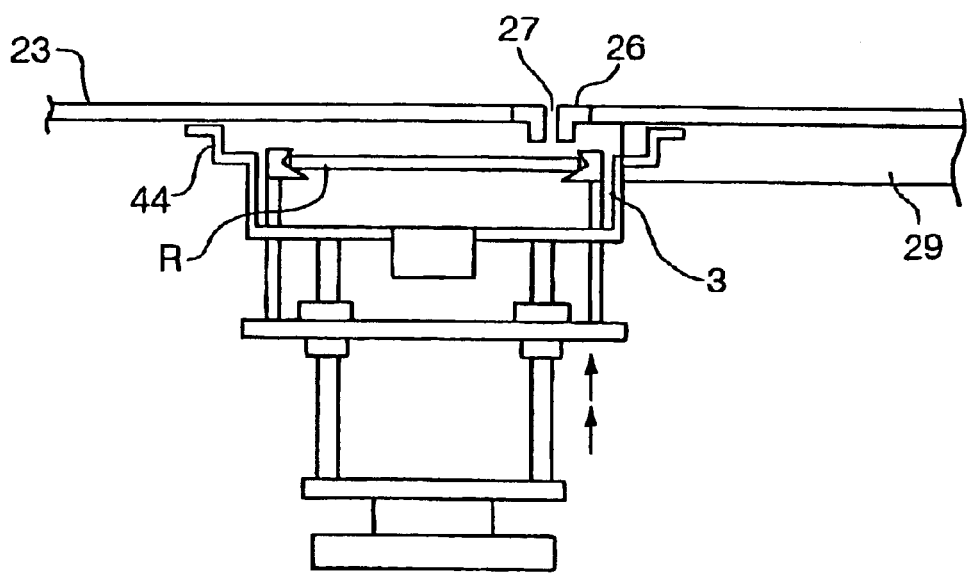
FIG. 11

COATING FILM FORMING SYSTEM

TECHNICAL FIELD OF THE INVENTION

The present invention relates to a system for supplying a coating liquid to various substrates, such as reticle substrates for photomasks, semiconductor wafers, or glass substrates for liquid crystal displays, to form a liquid film by the coating liquid.

DESCRIPTION OF RELATED ART

In a process for producing semiconductor devices and LCDs, a resist processing on a substrate to be processed is carried out by a technique called photolithography. In this processing, an exposure processing is carried out using a reticle substrate on which a predetermined mask pattern is formed. The formation of the mask pattern on the surface of the reticle substrate is carried out by a series of processes for applying a predetermined chemical (coating liquid) on the surface of a glass substrate to form a liquid film, and thereafter, exposing the liquid film to carry out a development to obtain a desired pattern.

As a conventional method for forming the above described liquid film, there has been adopted the spin coating method for holding a substrate in a horizontal state and rotating the substrate about a vertical axis and for supplying a coating liquid toward the center of the substrate from top to diffuse the coating liquid over the whole surface of the substrate by centrifugal force. However, in this method, there is a problem in that the periphery of the substrate easily becomes dirty since the coating liquid extends outwards, so that particles are easily produced from the coating liquid adhering to the peripheral portion. If particles adhere to the reticle substrate, the shadow of the particles becomes the shape of a circuit pattern as it is, so that it is required to avoid the adhesion of particles. As this measure, for a reticle substrate 11 having a zinc oxide layer 12 and a coating liquid layer 13 for forming a mask pattern as shown in FIG. 20, it is considered that it is effective to expose zinc oxide at the peripheral portion 14 of the substrate to be grounded, for example, in order to prevent the substrate from being charged during exposure by electron beams. However, the grounding method can not be adopted since the coating film is formed on the whole surface of the substrate in the case of the spin coating method.

Therefore, the inventor has studied that a coating device shown in FIG. 21 is used for carrying out a coating process. In the figure, reference number 11 denotes a rectangular reticle substrate which is horizontally held by a substrate holding portion (not shown) movable in Y directions. Above the reticle substrate 11, there are provided a plate 16 formed with a slit 15 extending in X directions, and a nozzle portion 17 for supplying a mask pattern forming coating liquid to the reticle substrate 11, which is arranged below the plate 16, via the slit 15. Reference numbers 18a and 18b are a pair of shutters which are provided on both sides of a slit 14 above the plate 16 and which have, e.g., a tray shape, so as to be capable of recovering the coating liquid dropping from the nozzle portion 17 moving above the shutters.

During a coating process, the nozzle portion 17 is reciprocated (scanned) in X direction from above the shutter 18a to above the shutter 18b, and the reticle substrate 11 arranged below the nozzle portion 17 is intermittent-fed in Y directions, so that the lines of the coating liquid having a length corresponding to the slit 15 are closely arranged on the surface of the reticle substrate 11 as shown in FIG. 22.

The length of the slit 15 is determined so as to prevent the coating liquid from being supplied to the periphery of the reticle substrate 11 and so as to expose the underlaying zinc oxide. The coating liquid which should be originally coated on the periphery of the reticle substrate is recovered by the shutters 18a and 18b.

In the method for scanning the nozzle portion to coat the coating liquid, the reticle substrate is not rotated, so that there are advantages in that it is possible to inhibit the peripheral portion from being contaminated, that it is possible to apply the coating liquid on the whole surface of the reticle substrate while exposing zinc oxide, and that it is possible to make good use of the coating liquid. However, during the supply of the coating liquid, there are some cases where part of the coating liquid hitting on the surface of the reticle substrate and the top face (liquid receiving face) and side faces (the faces of the shutters 18a and 18b facing each other) of the shutters splashes to fly off as mist, which becomes particles adhering to the surface of the reticle substrate. Particularly on the side face portions of the shutters on which the coating liquid first hits during the scanning of the nozzle portion, mist is easily produced by the shock of the hitting of the coating liquid. In addition, the downward flow of clean air is formed in the coating device, so that there is also a problem in that the mist produced around the shutters, together with the downward flow, easily flows toward the reticle substrate via the slit.

In addition, the thickness of the thin film of the coating liquid formed on the surface of the shutters gradually increases by repeating the coating process, and a part thereof is peeled off to cause particles. Therefore, the shutters must be removed in predetermined timing. For example, the shutters must be replaced with cleaned shutters, and the removed shutters must be cleaned, so that there is a problem in that work is troublesome. In addition, it is required to ensure a space required to clean the shutters, so that there is also a problem in that the system increase in size.

SUMMARY OF THE INVENTION

The present invention has been made in the circumstances, and it is an object of the present invention to provide a technique for scanning a nozzle portion in lateral directions and moving a substrate in longitudinal directions to inhibit particles from adhering to the surface of the substrate in a system for forming a liquid film of a coating liquid on the surface of the substrate. It is another object of the present invention to provide a technique for improving the yields of a coating film formed on the surface of a substrate.

According to one aspect of the present invention, a coating film forming system comprises: a substrate holding portion for horizontally holding a substrate; a first driving part for moving the substrate holding part in longitudinal directions; a nozzle portion, provided so as to face the substrate held on the substrate holding portion, for discharging a coating liquid to the substrate; a second driving part for moving the nozzle portion in lateral directions; a plate which has a slit being open so as to have a width corresponding to a lateral width of a coating region of the substrate and which is provided between the nozzle portion and the substrate; and a suction mechanism for sucking a suspended matter over a range corresponding to the width of the slit via a suction port which is provided in the vicinity of the slit, wherein the nozzle portion is moved in the lateral directions to linearly apply the coating liquid in linear coating regions on the substrate via the slit, and thereafter, the substrate is intermittently moved so as to closely arrange the linear coating regions in the longitudinal directions, to form a coating film.

With this construction, fine suspended matters, such as the mist of the coating liquid flying during a coating process, can be recovered by the slit, so that it is difficult to contaminate the substrate when the coating film is formed. If the suction port is provided above the plate in the vicinity of the slit, fine suspended matters, such as the mist of the coating liquid, can be recovered by the slit before flowing into the slit, so that it is difficult to contaminate the substrate when the coating film is formed. If the suction ports are provided above and below the plate in the vicinity of the slit, fine suspended matters, such as the mist of the coating liquid, can be surely recovered on both sides of upper and lower sides of the plate. The mist sucked by the suction port(s) includes mist produced by the discharge of the coating liquid from the nozzle portion, mist produced by the collision of the coating liquid with the shutter, and mist rebounding from the substrate. The mist directly discharged from the nozzle portion, and the mist produced by the collision of the coating liquid with the shutter mainly exist above the plate, and the mist produced by the collision of the coating liquid with the substrate mainly exists below the plate.

Particularly, in order to effectively recover the mist of the coating liquid of suspended matters, the suction port preferably has a width corresponding to a movable range of the nozzle portion in the lateral directions.

According to another aspect of the present invention, a coating film forming system comprises: a substrate holding portion for horizontally holding a substrate; a first driving part for moving the substrate holding part in longitudinal directions; a nozzle portion, provided so as to face the substrate held on the substrate holding portion, for discharging a coating liquid to the substrate; a second driving part for moving the nozzle portion in lateral directions; a plate which has a slit being open so as to have a width corresponding to a lateral width of a coating region of the substrate and which is provided between the nozzle portion and the substrate; and a shutter, provided on both ends of the slit, for receiving the coating liquid from the nozzle portion; a shock eliminating portion, provided on an end portion of a liquid receiving surface of the shutter on the side of the slit, for eliminating the shock of the coating liquid, which first hits on the shutter, to decrease the amount of occurrence of mist, when the nozzle portion moves above the shutter beyond the coating region of the substrate, wherein the nozzle portion is moved in the lateral directions to linearly apply the coating liquid in linear coating regions on the substrate via the slit, and thereafter, the substrate is intermittently moved so as to closely arrange the linear coating regions in the longitudinal directions, to form a coating film.

The shock eliminating portion is preferably formed so as to have an end portion facing in a lateral direction on the side of the slit on the liquid receiving surface and so as to protrude at an acute angle, and has a porous structure, and suction is preferably carried out in the shock eliminating portion. With this construction, it is possible to eliminate the shock of the coating liquid colliding with the shutter to remarkably reduce the occurrence of mist.

In addition to the above described construction, if the liquid receiving surface of the shutter is inclined with respect to the horizontally held substrate, and if a solvent supply port for supplying a solvent for washing the coating liquid adhering to the liquid receiving surface is formed in a region above the shock eliminating portion on the liquid receiving surface, and if a suction port for sucking the solvent is formed in a region below the shock eliminating portion on the liquid receiving surface, it is possible to prevent the coating liquid adhering to the liquid receiving surface from being solidified and suspended as particles. In order to more effectively prevent mist from flying, the suction port is preferably provided on the front side of the inclined liquid receiving surface, and the portion in the vicinity of the shutter and slit is preferably detachable.

According to a further aspect of the present invention, a coating film forming system comprises: a housing which defines a space for processing a substrate; a substrate holding portion, provided in the housing, for horizontally holding the substrate; a first driving part for moving the substrate holding part in longitudinal directions; a nozzle portion, provided in the housing so as to face the substrate held on the substrate holding portion, for discharging a coating liquid to the substrate; a second driving part for moving the nozzle portion in lateral directions; a filter unit for supplying clean air into the housing; a plate for dividing the interior of the housing into an upper space including the filter unit and the nozzle portion, and a lower space including the substrate holding portion and the substrate held on the substrate holding portion; a slit which is formed in the plate so as to have a width corresponding to a lateral width of a coating region of the substrate so that the coating liquid supplied from the nozzle portion is applied on the coating region of the substrate; one or more vent holes, which are formed in the plate in a region other than a movable region of the substrate in the lower space when the plate is viewed from top, so that air supplied from the filter unit flows into the lower space; and exhaust means for exhausting air from the lower space, wherein the nozzle portion is moved in the lateral directions to linearly apply the coating liquid in linear coating regions on the substrate via the slit, and thereafter, the substrate is intermittently moved so as to closely arrange the linear coating regions in the longitudinal directions, to form a coating film.

With this construction, it is possible to prevent a downward flow from concentrating on the slit in the upper space, and air flows so as to avoid the substrate in the lower space, so that it is difficult for mist to be directed to a reticle substrate R even if the mist is produced in the upper space. In order to prevent the air flow from remaining in the housing and in order to uniformly carry out cleaning, the flow rate of supply air in the filter unit is preferably coincident with the total amount of the flow rate of exhaust air in the housing.

BRIEF DESCRIPTION OF THE DRAWINGS

FIG. 4 is a schematic plan view showing the construction of a substrate holding portion;

FIG. 5 is a longitudinal sectional view showing a portion in the vicinity of a gripping portion of the substrate holding portion;

FIG. 10 is an illustration showing the operation of a previous step before a coating process after a substrate is fed;

FIG. 11 is an illustration for explaining the positional relationship of a supporting substrate during upward movement;

BEST MODE FOR CARRYING OUT THE INVENTION

Figure 1:
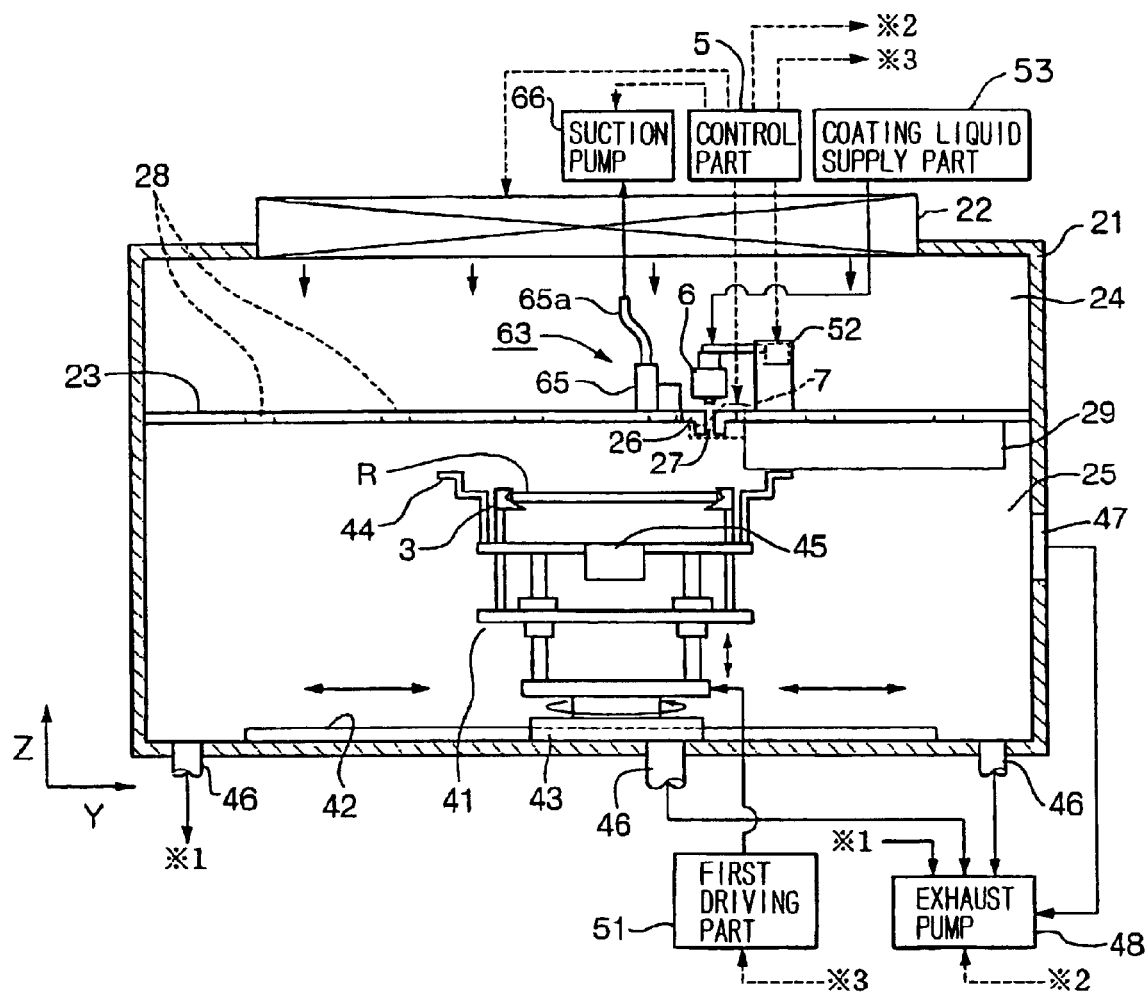
FIG. 1 is a longitudinal sectional view showing a preferred embodiment of a coating film forming system according to the present invention.
Figure 2:
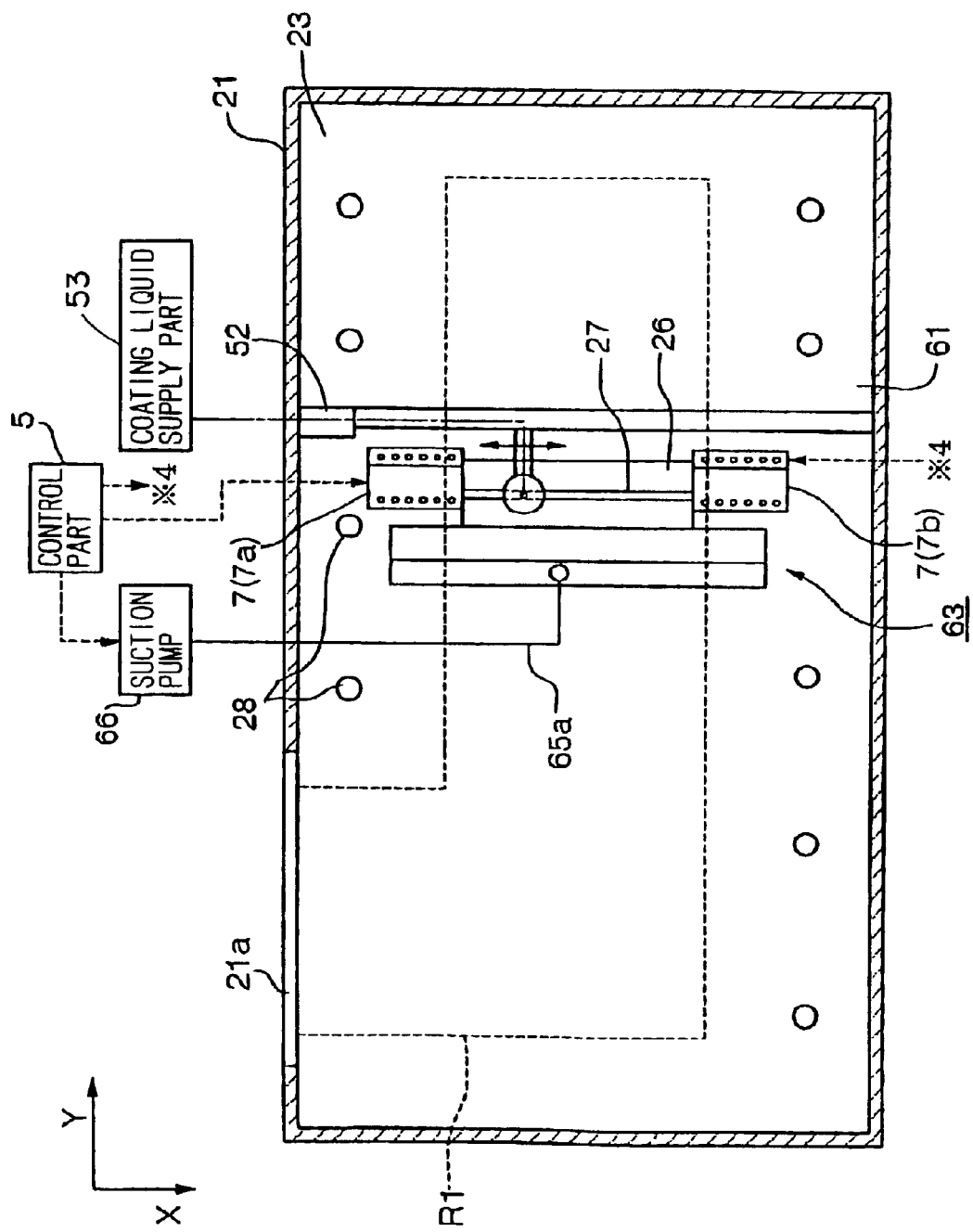
FIG. 2 is a plan view showing a lower space in the preferred embodiment.
Figure 3:
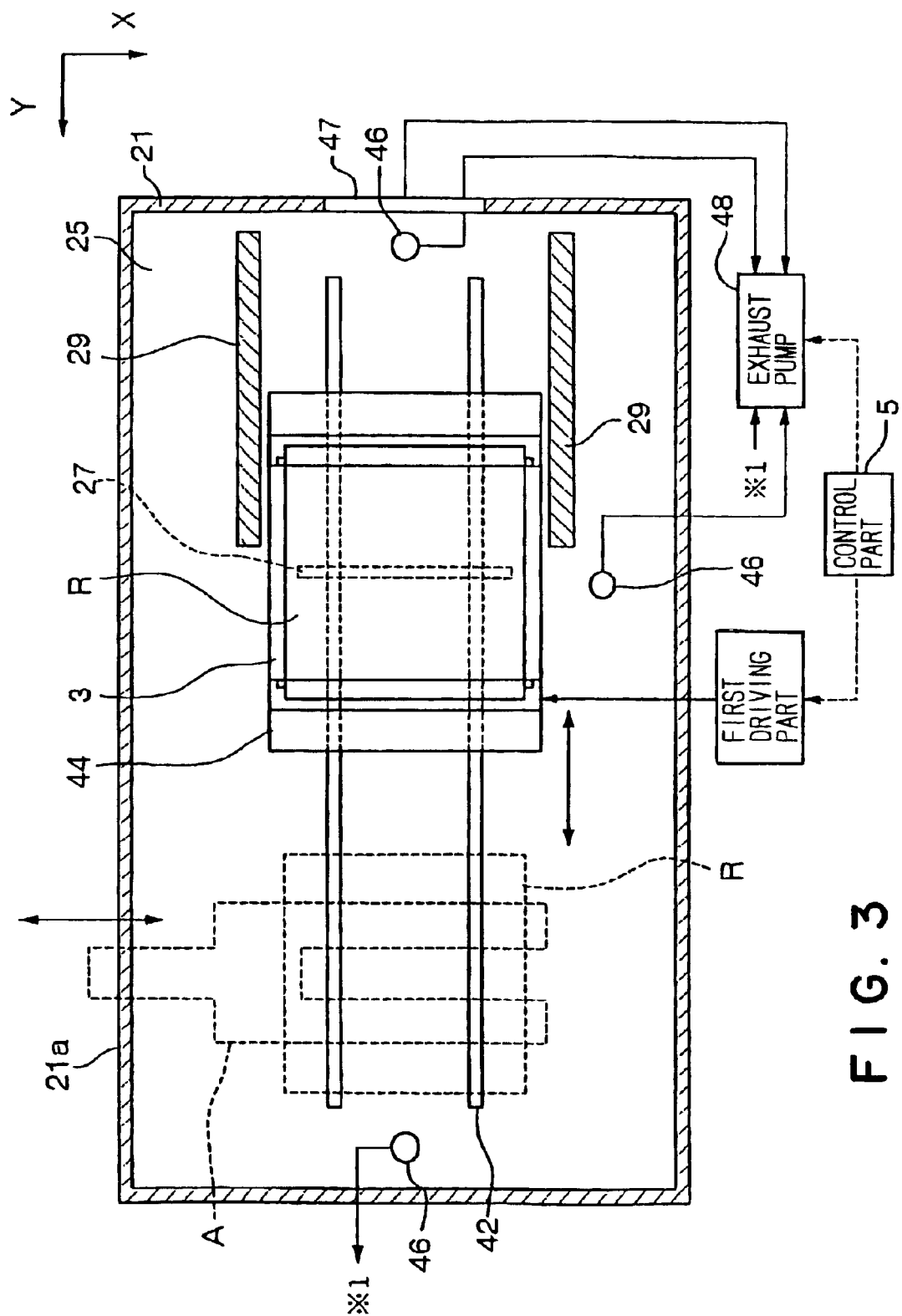
FIG. 3 is a plan view showing an upper space in the preferred embodiment.

Referring to FIGS. 1 through 9, as the first preferred embodiment of a coating film forming system according to the present invention, an example where a liquid film (coating film) of a mask pattern forming coating liquid is formed on a reticle substrate will be described below. FIG. 1 is a longitudinal sectional view showing the entire structure of the coating film forming system in this preferred embodiment. The system is surrounded by a housing 21 forming an armoring body. On the ceiling portion, a filter unit 22 for cleaning a gas, e.g., air fed from the outside of the system, to supply the cleaned gas downwards is provided. The inner space thereof is divided by a horizontal plate 23 into upper and lower spaces. The upper and lower spaces defined by the housing 21 and the plate 23 will be referred to as upper and lower spaces 24 and 25. A reticle substrate R is mounted in the lower space 25. A coating liquid is applied on the reticle substrate R from the upper space 24 via a slit 27 of a slit member 26 fitted into the plate 23. The layout thereof will be described later. The plate 23 is formed with a plurality of vent holes 28, so that air supplied from the filter unit 22 can flow into the lower space 26. Since this preferred embodiment has such a construction, a plan view corresponding to the above described longitudinal sectional view (FIG. 1) is divided into FIG. 2 showing a state that a ceiling portion is removed to view the housing 21, and FIG. 3 showing a state that the plate 23 is removed. Each of the spaces will be sequentially described below.

First, the lower space 25 will be described. Reference number 3 denotes a substrate holding portion for gripping the reticle substrate R having, e.g., a square shape, at, e.g., its four sides and for holding the substrate R in a horizontal state. The substrate holding portion 3 is supported on a movable body 43, which moves while being guided by a rail 42 extending in Y directions, via a supporting substrate 41 which is vertically movable below the substrate holding portion 3 and which is rotatable about a vertical axis. On the supporting substrate 41, there is provided a cover body 44 which surrounds the front and rear sides and bottom side of the substrate holding portion 3 and reticle substrate R gripped by the substrate holding portion 3 and which is raised to a slightly higher level than the surface of the reticle substrate R.

By the way, on the bottom face of the plate 23 dividing the housing 21 into upper and lower spaces, there are provided a pair of hanging wall 29 extending Y directions as shown in FIGS. 1 and 3. The lateral width of the cover body 44 is determined so that the cover body 44, together with the hanging wall 29 and the plate 23, can surround the periphery of the reticle substrate R via a slight clearance when the cover body 44 moves toward the front end in Y directions with the movement of the movable body 43. Furthermore, the plate 23, the cover body 44 and the hanging wall 29 correspond to a volatilization protecting portion as claimed in claims.

The supporting substrate 41 can move, stage by stage, in vertical directions from the state shown in FIG. 1. For example, when the reticle substrate R is carried in the housing 21, the supporting substrate 41 moves downwards, and when a coating process is carried out, the supporting substrate 41 moves upwards by one or two stages in accordance with the status from the state that the reticle substrate R is carried in. For example, the supporting substrate 41 moves upwards by two stages when the coating process is carried out. At this time, a slight gap is formed between the top face of the cover body 44 and the bottom face of the plate 23.

On the other hand, a blow means being a gas supply means for spraying a solvent with a gas, e.g., air, upwards is provided on the bottom face of the cover body 44. The blow means 45 is designed to blow air containing a solvent toward the reverse surface of the reticle substrate R, to form a solvent atmosphere in, e.g., a space surrounding the reticle substrate R, to inhibit the solvent from volatilizing from the coating liquid applied on the surface of the reticle substrate R. Therefore, the solvent supplied with the gas is the sale as that contained in the coating liquid, and a thinner solution is herein used.

Figure 6:
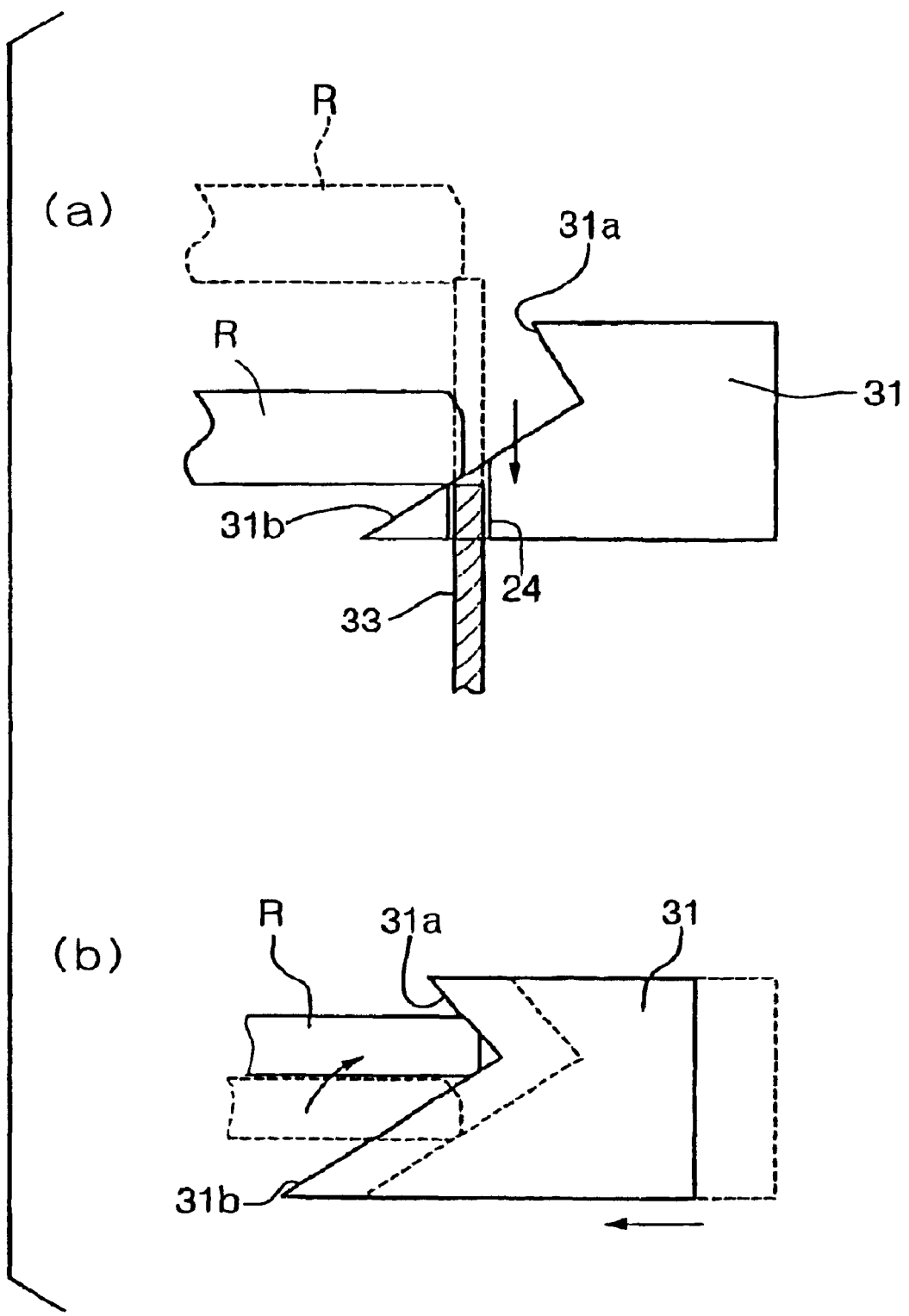
FIG. 6 is an illustration showing the state that a reticle substrate is delivered in the substrate holding portion.

Referring to FIGS. 4 through 6, the construction of the substrate holding portion 3 and portions related thereto will be described below. As shown in FIG. 4, the substrate holding portion 3 is designed to press the four sides of the reticle substrate R by the gripping portions 31 having the same shape inwardly (toward the substrate), to hold the reticle substrate R in a horizontal state. The bottom end portions of these gripping portions 31 are supported on a supporting portion 32 vertically extending from the supporting substrate 41. The gripping portion 31 is provided with lifting pins 33, which pass through the gripping portion 31, for delivering the reticle substrate R from, e.g., a transfer arm A, at three places shown in FIG. 4. In FIG. 4, A1 shown by a dotted line denotes a fork-shaped transfer arm for delivering the reticle substrate R from and to the substrate holding portion 3. The lifting pins 33 are provided at positions at which the lifting pins 33 do not contact the transfer arm A1 and can deliver the reticle substrate R in a substantially horizontal state. The number of the lifting pins 33 is preferably three or more. For example, the number of the lifting pins 33 may be five. The gripping portions 31 and the lifting pins 33 are movable by the operation of a driving mechanism (not shown) so as to approach or leave the reticle substrate R as shown by arrows in the figure, although the details thereof will be described later.

Referring to FIG. 5, the structure of the gripping portions 31 as an example of places at which the lifting pins 33 are provided will be described below. As shown in the figure, the outer peripheral surface of the reticle substrate R is cut so that the upper and lower end corner portions thereof are inclined. The inclined surfaces 31a and 31b of the gripping portion 31 having an L-shaped cross section correspond to the angles of upper and lower cut surfaces (which will be hereinafter referred to as C surfaces). The gripping portion 31 has such a shape that the lower inclined surface 31b protrudes from the upper inclined surface 31a. For example, if the reticle substrate R is held in a horizontal state at a position shown in FIG. 5, a hole 34 through which the lifting pin 33 passes is formed below the holding position.

When the reticle substrate R is carried in the housing 21, the operation of the delivery of the reticle substrate R between the substrate holding portion 3 and the transfer arm A1 will be briefly described. First, as shown by the dotted line in FIG. 3, the reticle substrate R is carried in the housing 21 by the transfer arm A via an opening 21a which is formed in the side of the housing 21. The transfer arm A is designed to carry the reticle substrate R in a state that the transfer arm A supports thereon the cut surface on the reverse side of the reticle substrate R.

The substrate holding portion 3 stands by so that each of the lifting pins 33 is positioned below the C surface of the reticle substrate R when the transfer arm A approaches a predetermined delivering position in the housing 21. If all of the lifting pins 33 are moved upwards, the reticle substrate A is delivered from the transfer arm A as shown by dotted lines in FIG. 6(a), so that the transfer arm A is retracted. Thereafter, if the lifting pins 33 are moved below the inclined surface 31b, the C surfaces of the lower four sides of the reticle substrate Rare supported on the inclined surface 31b (solid line in FIG. 6(a)). In this state, if the gripping portion 31 is moved toward the reticle substrate R, the reticle R moves upwards along the inclined surface 31b, and the upper C surfaces contact the inclined surface 31a, so that the reticle substrate R is held in a substantially horizontal state.

Referring to FIGS. 1 and 3 again, other portions in the lower space 25 will be described. The bottom face of the housing 21 is provided three exhaust ports 46 at positions shown in the figure, and the front face of the reticle substrate R (it is assumed that the moving direction of the reticle substrate R during application is the front side) is also provided with an exhaust port 47. Each of the exhaust ports 46 and 47 is associated with an exhaust pump 51, which is commonly connected to each of the exhaust ports 46 and 47, for forming an exhaust means. The flow rate of exhaust air in the exhaust pump is controlled by a control part 5 which is provided, e.g., outside of the system. The control part 5 is designed to move the movable body 43 in Y directions (forwards and backwards) and to control a first driving part 52 for driving each of driven parts in the substrate holding part 3 and supporting substrate 41 which are connected to the movable body. Various pipes and wires connecting these systems are housed in, e.g., a housing area (not shown) which is provided by separating the housing 21. Pressure in this housing area is controlled so as to be, e.g., a negative pressure lower than that in a processing space in which the reticle substrate is mounted.

The interior of the upper space 24 will be described below. First, referring to FIG. 2, the positions of the above described vent holes 28 formed in the plate 23 will be described. An L-shaped region R1 shown by a dotted line in the figure shows a region in which the reticle substrate R is movable while being guided by the above described rail 42 after being carried in the housing 21 when it is viewed from top. As shown in the figure, the vent holes 28 are positioned so as to prevent a downward flow, which is formed by the filter unit 22, from concentrating at the slit 27, to uniformly disperse the downward flow and to allow the air flow to be directed to the outside of the region R1 in the lower space 25.

Other portions will be briefly described. Above the slit 27, a nozzle portion 6 for applying a coating liquid on the reticle substrate R via the slit 27 is provided. At the right and left ends of the slit 27, a pair of shutters 7 (7a, 7b) are detachably provided so as to sandwich the slit 27. Moreover, a second driving part 52 for reciprocating the nozzle portion 6 along the guide member 61 in X directions (lateral directions) is provided in front of the nozzle portion 6, and a suction mechanism 63 for sucking atmosphere in the vicinity of the slit 27 and shutters 7 (7a, 7b) is provided behind the nozzle 6. The second driving part 52 is controlled by the control part 5, and the supply of the coating liquid in the nozzle part 6 is also controlled by the control part 5 via a coating liquid supply part 53.

Figure 7:
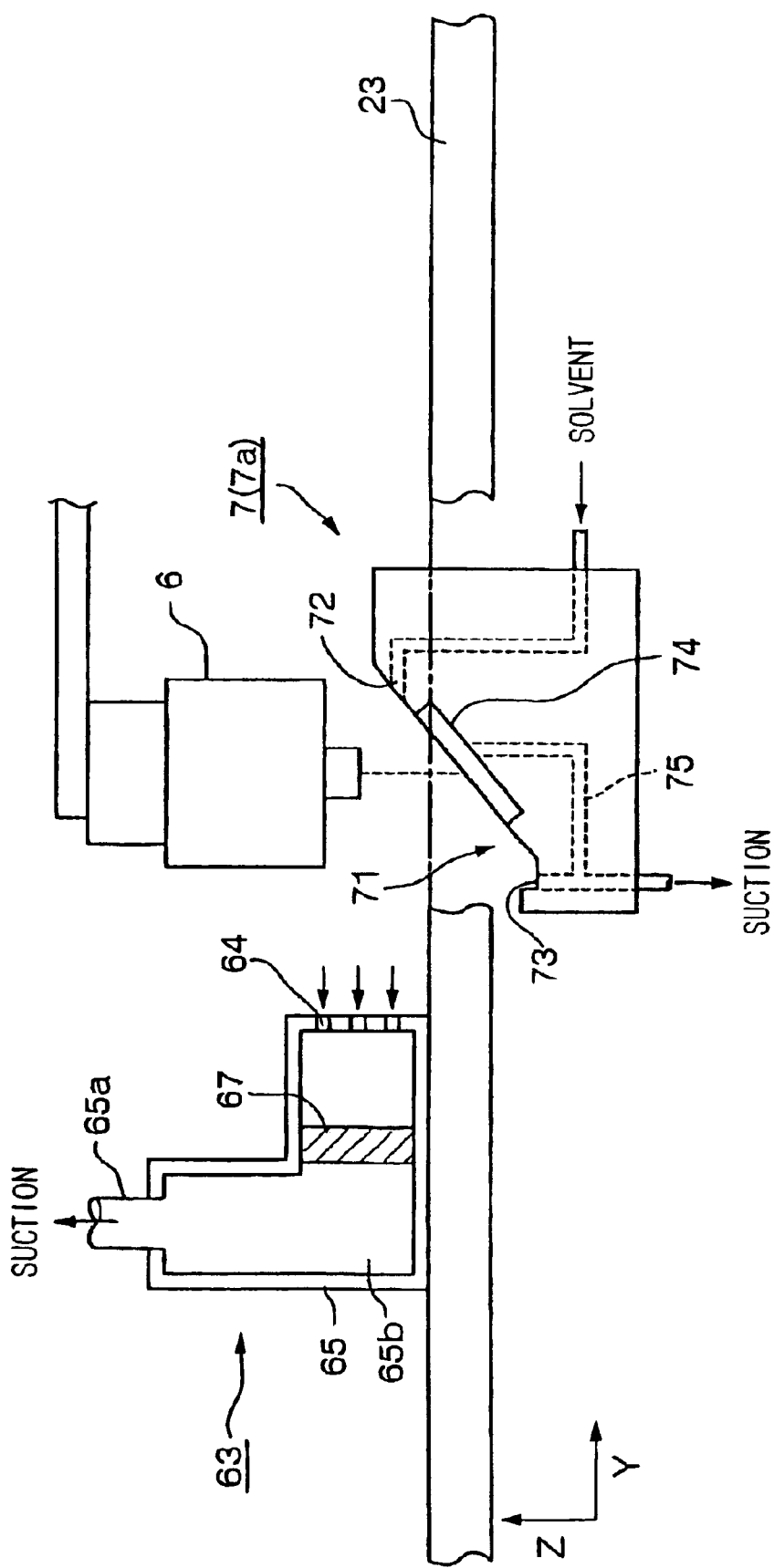
FIG. 7 is a schematic longitudinal sectional view for explaining a portion in the vicinity of a slit.

Referring to FIGS. 1, 2 and 7, the suction mechanism 63 will be described in detail. The suction mechanism 63 comprises a suction unit 65 which has a suction port 64 in front, and a suction pump 66 which is connected to, e.g., a piping 65a connected to the top end portion on the rear side thereof. The suction port 64 is formed in a range in X directions corresponding to the slit 27 and shutters 7 (7a, 7b), i.e., over a width substantially corresponding to the movable region of the nozzle portion 6. As shown in FIG. 7, a cavity portion 65b forming a buffer space is formed in the suction unit 65 for stabilizing the air flow, which is directed from the suction port 64 to the piping 65a, to uniform suction force every portion in the suction port 64. In this cavity portion 65b, there is provided a trap mechanism 67 comprising, e.g., a mesh or the like, for recovering the mist of the coating liquid which is sucked, e.g., when a coating process is carried out. In this preferred embodiment, this trap mechanism 67 also serves as a straightening vane for stabilizing the air flow. Furthermore, for convenience of description, the slit 27 and the slit member 26 are omitted from FIG. 7.

Mainly referring to FIGS. 7 through 9, the shutters 7 (7a, 7b) will be described below in detail. FIG. 7 is a longitudinal sectional view showing the shutter 7a as an example. The top face of the shutter 7a forms a liquid receiving surface 71 which is inclined so as to be lower on the front side. In the vicinity of the top end portion of the liquid receiving surface 71, there is formed a solvent supply port 72 for supplying a solvent, which is supplied from a solvent supply part (not shown), on the entire region of the liquid receiving surface 71. The solvent supplied from the solvent supply port 72 is used for preventing the coating liquid adhering to the liquid receiving surface 71 from remaining therein, or for washing the adhering coating liquid. Specifically, for example, a thinner solution is used. In the vicinity of the lower end portion of the liquid receiving surface 71, there is formed a suction port 73 which is slightly raised to prevent the dropping thinner solution or the like from dropping and which collects the dropping liquid.

Figure 8:
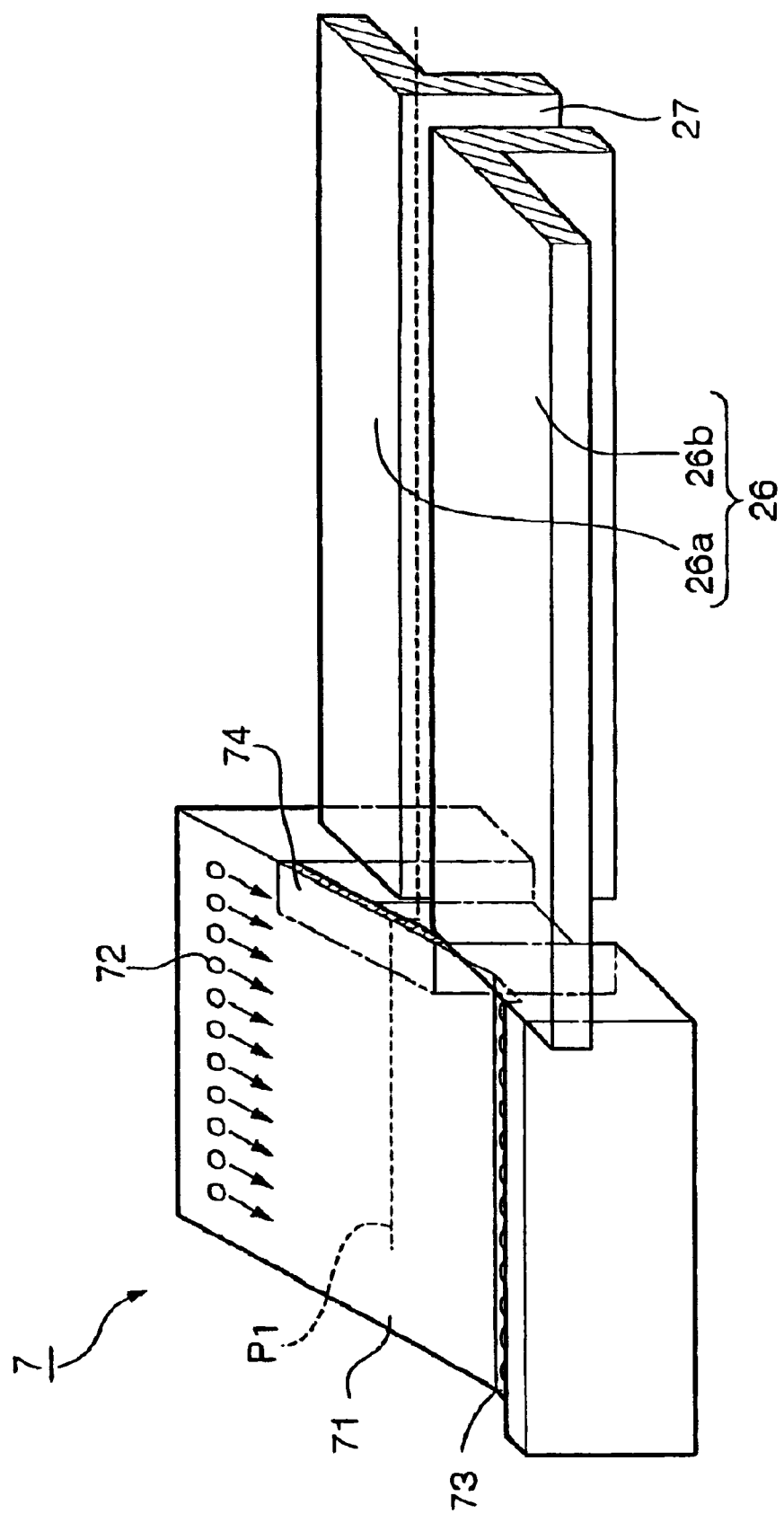
FIG. 8 is a perspective view showing the relationship between the positions of a shutter and a slit member, and a supply line for a coating liquid.

Since the nozzle portion 6 supplies the coating liquid while reciprocating over the shutters 7 (7a, 7b) during a coating process, the coating liquid is supplied to the liquid receiving surface 71 along a locus P1 shown by a dotted line in FIG. 8, and first hits on the end portion of the liquid receiving surface 71 on the side of the slit 27. In this portion, mist is easily produced from the coating liquid by the shock of collision. In order to prevent this, this end portion is formed as a protruding end which protrudes from a portion below this place. This portion will be referred to as a shock eliminating portion 74. For example, as shown in FIG. 9, the shock eliminating portion 74 has a tip portion of an acute angle with respect to a lateral direction, i.e., the direction of collision of the coating liquid P2 (traveling direction). The material of the shock eliminating portion 74 is a material having a porous structure, such as a polyvinyl alcohol. For example, as shown in FIG. 7, a passage 75 connected to the suction port 73 and a suction pump (not shown) is connected to the inside of the shock eliminating portion 74, so that the shock of the coating liquid colliding with the shock eliminating portion is eliminated and sucked.

Figure 9:
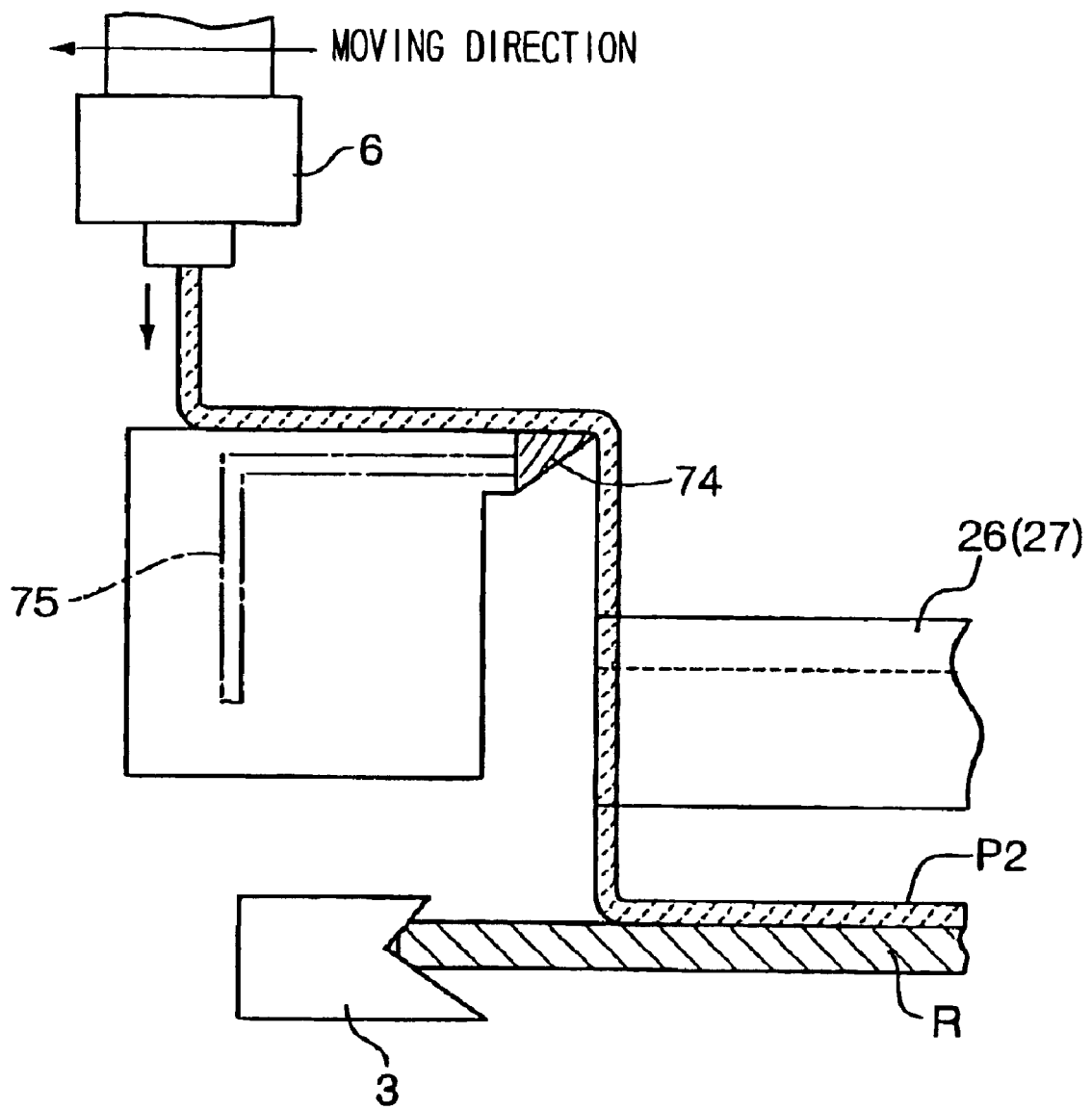
FIG. 9 is an illustration shoring a shock eliminating portion and a portion around the shock eliminating portion.

Furthermore, as an example of the shape of the shock eliminating portion 74, the tip end has a triangular cross section having an acute angle with respect to the direction of collision of the coating liquid P2 in FIG. 9. However, the shape of the shock eliminating portion 74 may have a cylindrical cross section which has a tip end being tapered toward the direction of collision with respect to the direction of collision of the coating liquid P2. In the case of the shock eliminating portion 74 having the cylindrical cross section, the coating liquid moves along the cylindrical surface in a direction opposite to the direction of collision, so that the shock of the coating liquid with the shock eliminating portion 74 can be decreased.

Then, the slit member 26 will be described. As shown in FIGS. 8 and 9, the slit portion 26 comprises a pair of members 26a and 26b having an L-shaped cross section which are provided between the shutters 7a and 7b, and the slit 27 is formed between the facing surfaces of the members 26a and 26b. For example, the width of the slit 27 in longitudinal directions is such an extend that the coating liquid supplied from the nozzle portion 6 is directed downwards via a slight clearance. The facing surfaces of the members 26a and 26b forming this narrow slit 27 extend downwards so as to prevent the inflow of the downward flow which is formed by the filter unit 22 provided above the slit 27.

Referring to FIGS. 1 and 2 again, other portions will be described below. In the upper space 24, the control part 5 is designed to control the flow rate of air in the filter unit provided on the ceiling portion, and the flow rate of exhaust air in the suction pump 66. That is, the control part 5 is designed to carry out the control of all supply and exhaust air in the housing 21, in addition to the control of the exhaust pump for adjusting the flow rate of exhaust air in the lower space 25. For example, the flow rate of supply air in the filter unit 21 is controlled so as to be coincident with the total value of the flow rate of exhaust air which is exhausted via the suction port 64 in the upper space 24, and the flow rate of exhaust air which is exhausted via the exhaust port 46 in the lower space 25.

The operation of this preferred embodiment will be described below. First, the shutter (not shown) is open, and the transfer arm A enters the housing 21 via the opening 21a to deliver the reticle substrate R to the substrate receiving portion 3 by the above described procedure. At this time, the portion of the cover 44 raised upwards faces forwards in which the slit 27 is formed. When the substrate holding portion 3 receives the reticle substrate R to complete the horizontal holding of the reticle substrate R, the supporting substrate 41 rotates by 90 degrees as shown by arrow in FIG. 10(a). Then, after the cover body 44 faces the opening 21a, the supporting substrate 41 is moved upwards by one stage. In this state, the reticle substrate R is moved to a position at which the tip portion of a coating region is positioned below the slit 27, and the nozzle portion 6 is scanned in an approach route as shown by arrow, to form a line of coating liquid on the surface of the reticle substrate.

Thereafter, as shown in FIG. 10(b), the reticle substrate R is moved forward while maintaining its height, and then, the scanned nozzle portion 6 is scanned in a return route as shown by arrow, to form a line of coating liquid on the end portion of the coating region opposite to the region in which coating has been carried out. At this time, the supporting substrate 41 is in a state that it is moved by one stage from the lowest stage in which the reticle substrate R is received. In this state, the height of the top end portion of the cover body 44 is slightly lower than the lower end of the hanging wall 29 as shown by a solid line in FIG. 11(a), so that both do not contact each other even if the cover body 44 faces in any directions. Then, as shown in FIG. 10(c), the reticle substrate R is retracted once, and rotated by 90 degrees in a position at which the reticle substrate R does not contact the hanging wall 29. Thus, the reticle substrate R is returned to the original direction, and the supporting substrate 41 is moved upwards by one stage.

FIG. 11(b) shows a state that the supporting substrate 41 is moved upwards by two stages. As shown in this figure, the top end of the cover body 44 is moved upwards to a position in the vicinity of the lower surface of the plate 23. A step of forming two lines of coating liquid, each of which is the same as the above described line of coating liquid, will be hereinafter referred to as a previous step, and a step subsequently carried out will be hereinafter referred to as an after step. The upward movement by two stages is carried out only at the after step. In addition, the direction of the cover body 44 at the after step is always in a state shown in FIG. 11(b). That is, the upward movement by two stages is carried out only when the portion of the cover body 44 raised above the reticle substrate R is directed in longitudinal directions. Therefore, even if the reticle substrate R is moved in longitudinal directions, the cover body 44 does not contact the hanging wall 29. In this state, the coating liquid is supplied as shown by arrow with respect to the tip end portion of a region which has been coated and which is sandwiched between two lines of coating liquid.

Figure 12:
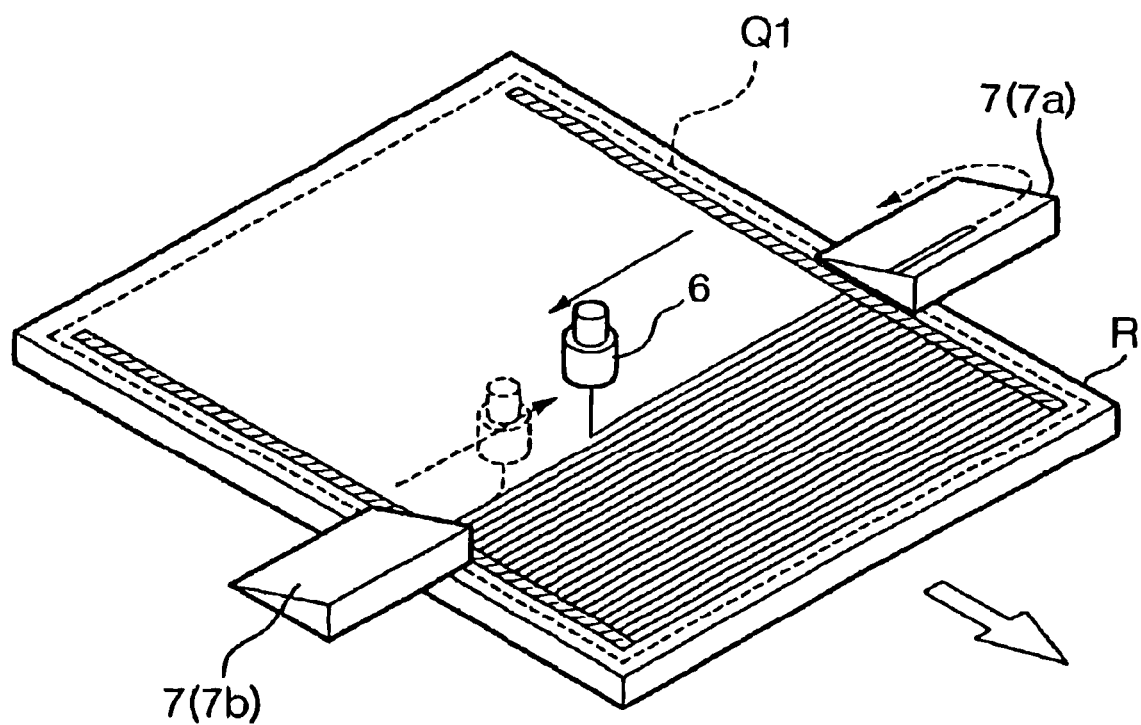
FIG. 12 is an illustration showing the operation of an after step after a coating process.
Figure 13:
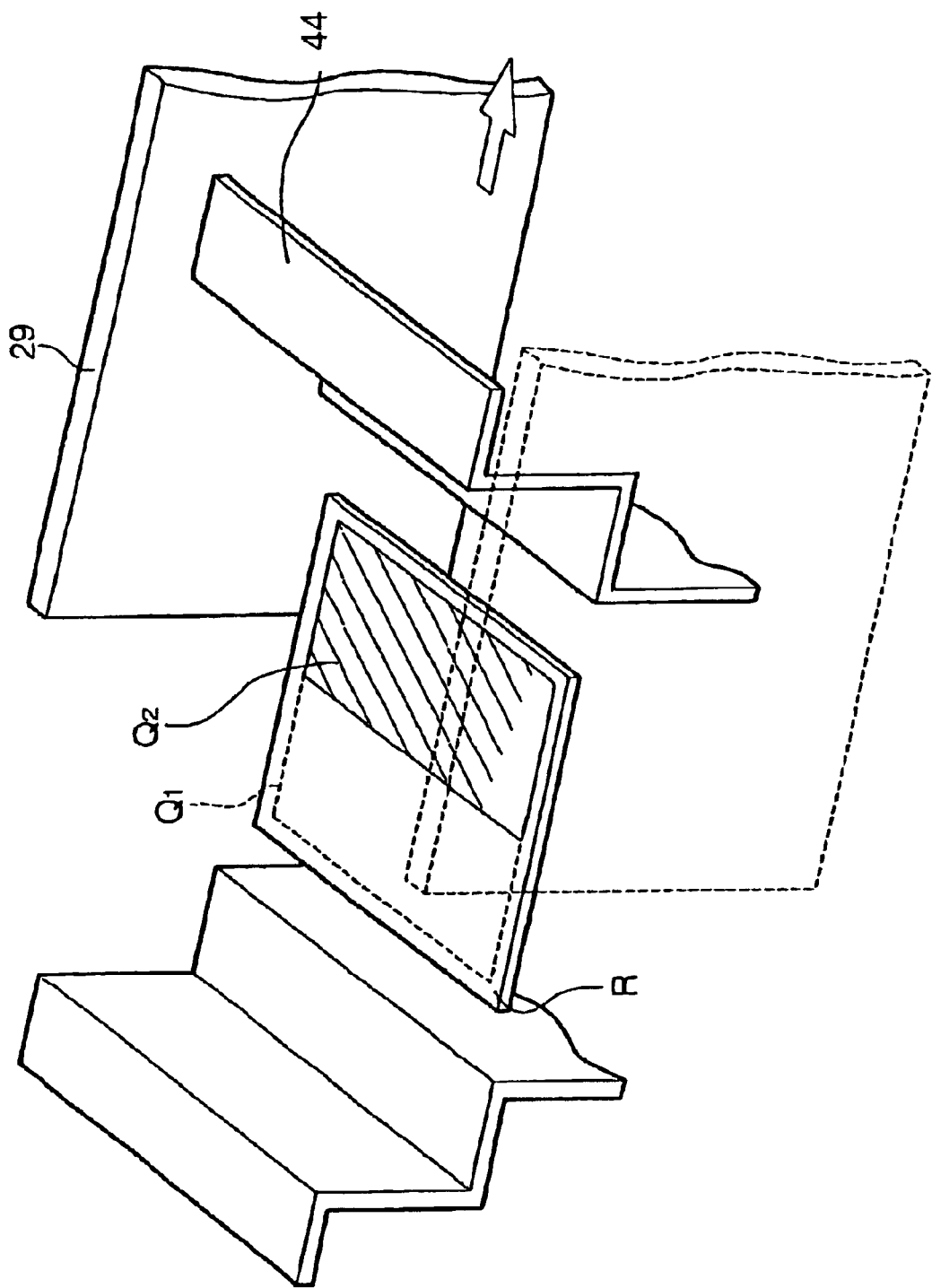
FIG. 13 is an illustration showing the operation of an after step after a coating process.
Figure 14:
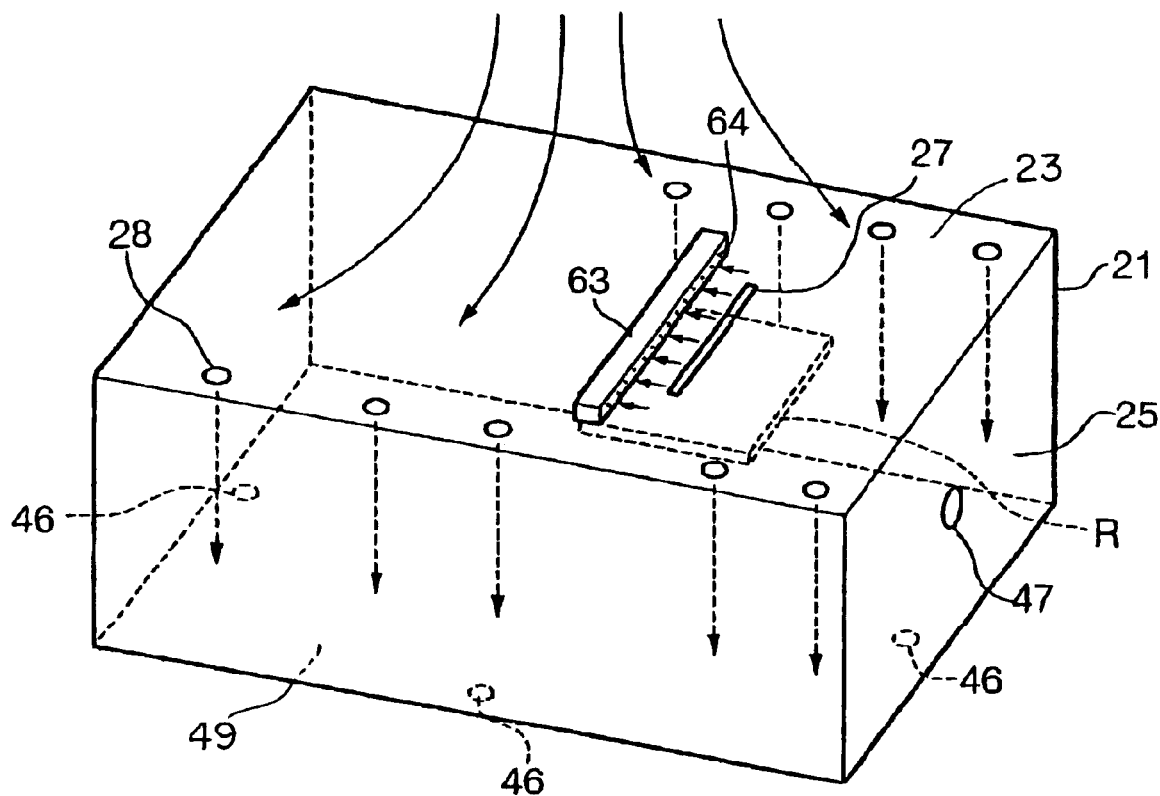
FIG. 14 is an illustration showing the direction of the air flow formed in a housing 21.

Referring to FIGS. 12 and 13, the operation at the after step will be described below in detail. First, also as shown in FIG. 10(b), the nozzle portion 6 is scanned in an approach route from one end to the other end at the position of the tip of the coating region Q1 on the reticle substrate R, to apply a line of coating liquid between the two lines of coating liquid applied at the previous step. Then, for example, the reticle substrate R is moved forward while the nozzle portion 6 reciprocates on the shutter 7 (7a). Thereafter, the nozzle portion 6 is scanned in a return route. For example, the distance of the forward movement of the reticle substrate R during the reciprocation of the nozzle portion 6 has been previously adjusted so that adjacent lines of coating liquid are closely arranged. Thereafter, as described above, the coating by scanning the nozzle portion 6 in X directions and the intermittent movement of the reticle substrate R in Y directions are repeated, so that the lines of coating liquid are closely arranged on the surface of the reticle substrate R as shown in FIG. 12.

If coating proceeds at the after step, the reticle substrate R gradually enters the space defined by the hanging wall 29 also as shown in FIG. 10. The hanging wall 29 is located in front of the slit 27 as described above. Therefore, the region that the reticle substrate R enters the above described space is coincident with a coated region Q2 at that time as shown in FIG. 13. Thus, the reticle substrate R is processed while the coated region Q2 is surrounded by the plate 23 (not shown in this figure), the cover body 44 and the hanging wall 29.

Air flow in the housing 21 during a coating process will be described below. Air supplied above the top face of the plate 23 from the filter unit 22 is fed to the lower space 25 via the plurality of vent holes 28, and air in the lower space 25 is exhausted via the exhaust port 46 which is provided in the bottom of the housing 21 in the vicinity of the side thereof, or via the exhaust port 47 which is provided in the side of the housing 21. Therefore, air flow forms a downward flow so as to avoid the reticle substrate at the center. As described above, air supplied from the filter unit 22 has been cleaned, and serves as a carrier for discharging, e.g., mist produced from the coating liquid during the coating process, and particles produced from the respective driving portions, with air flow to the outside. Although part of air flow moves to the vicinity of the slit 27, suction is always carried out by the suction port 64 in this portion. Therefore, air hardly flows into the slit 27, and flows to the suction port 64 with mist which is produced in the movable region of the nozzle portion 6 above the slit 27 and which is produced in the vicinity of the shutter 7.

Figure 15:
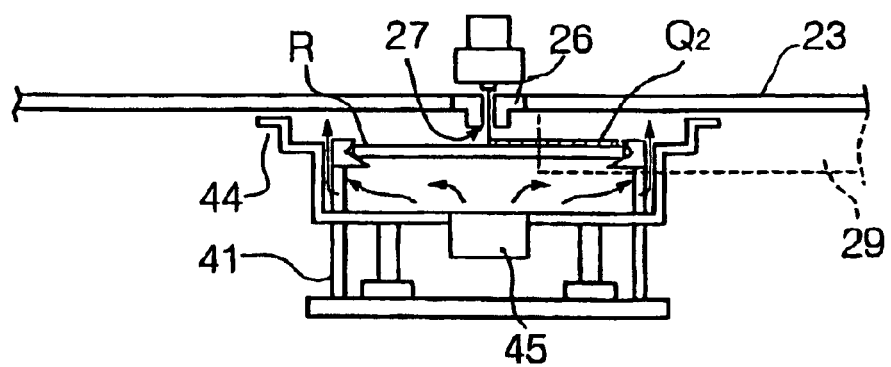
FIG. 15 is an illustration showing the operation of an after step after a coating process.

On the other hand, in the space surrounded by the plate 23, cover body 44 and hanging wall 29 which are arranged around the reticle substrate R at the after step, an air and thinner are sprayed by the blow means which is provided in the lower end portion of the cover body 44 as shown in FIG. 15. Therefore, the atmosphere of thinner is formed in the space, and a flow of thinner gas shown by arrow in the figure is formed over the entire circumference. In this state, the after step is carried out. Furthermore, in the region of the plate 23 surrounded by the hanging wall 29, a cooling means (not shown) for cooling the lower surface of the plate 23 is provided. At the after step, the above described formation of the flow of thinner gas, and the cooling of the space above the reticle substrate R from the side of the top face are carried out. If the formation of the coating film is thus completed, the reticle substrate R is carried out to the outside of the housing 21 in the procedure opposite to that during the carrying-in.

Furthermore, the plate 23 forming the top face of the lower space 25 may be formed of a punching metal plate, and the bottom face 49 of the lower space 25 may also be formed of a punching metal plate. The diameter of the holes of the punching plate is, e.g., 5 mm, and the pitch thereof is, e.g., 10 mm. By forming the plate 23 and the bottom face 49 of punching metal plates, pressure loss is caused when the gas passes through the punching metal plate, and the gas passes through the holes while extending over the entire surface of the punching metal plate. As a result, the gas passes through the holes in the entire surface of the punching metal plate, so that it is possible to obtain a uniform air flow over the entire surface of the punching metal plate.

As described above, according to this preferred embodiment, the suction port 64 is provided in the vicinity of the slit 27 to suck the gas over the range corresponding to the movable region of the nozzle portion 6, so that it is possible to inhibit fine suspended matters, such as mist, of the components of the coating liquid from contaminating the surface of the reticle substrate R via the slit. The mist sucked into the suction port 64 includes (1) mist bounding from the reticle substrate R via the slit 27, and (2) mist produced in the vicinity of the shutter 7, in addition to mist produced when the coating liquid is discharged from the nozzle portion 6. In this preferred embodiment, the slit portion 26 having the slit 27 is formed so as to be narrow in X directions and so as to be extended (thickened) downwards, to inhibit the bounding of mist (1), and the shock eliminating portion 74 is provided on the end portions of the shutters 7 (7a, 7b) to eliminate the shock of the collision of the coating liquid and to suck the coating liquid colliding with the inside thereof, to reduce the production of mist (2). Therefore, the production of the mist itself in the suction region of the suction port 64 is inhibited, so that the above described effects are further enhanced. In addition, the slit portion 26 and the shutters 7 (7a, 7b) are detachable so as to be easily cleaned. Also at this point, it is possible to prevent the above described suspended matters from being produced, so that it is possible to effectively prevent the reticle substrate R from being contaminated.

In addition to the above described effects, the shutters 7 causes the thinner solution from flowing to the inclined liquid receiving surface 71, and recovers it on the lower side to prevent the coating liquid from remaining in the adhering portion. Therefore, for example, it is also possible to prevent particles from being produced from the solidified coating liquid. Even if the coating liquid colliding with the thinner solution flies to produce mist, suction is carried out by the suction port 64 in front of the liquid receiving surface 71, so that there is little possibility that mist flies.

Moreover, since the plurality of vent holes 28 formed in the plate 23 are arranged outside of the movable region of the reticle substrate R when the plate 23 is viewed from the top, it is possible to the downward flow from concentrating on the slit in the upper space 24, and since air flows so as to avoid the reticle substrate R in the lower space 25, air does not flow toward the reticle substrate R even if mist is produced in the upper space 25. In addition thereto, the flow rate of supply gas to the housing 21 is controlled so as to be coincident with the total amount of the flow rates of exhaust air in the housing 21, so that air flow does not remains in the housing 21. Therefore, in this preferred embodiment, it is possible to clean the entire region of the interior of the housing 21 by the downward flow. In addition, since air is exhausted from the bottom face as well as the side face in the lower space 25, it is possible to prevent the stagnation portion of air flow from being produced in the unit, so that it is possible to always produce clean air flow in the unit.

Moreover, since the reticle substrate R is surrounded by the plate 23, the cover body 44 and the hanging wall 29 in the lower space 25 during the coating process, it is possible to form a coating film while preventing the reticle substrate R being contaminated. Particularly in this preferred embodiment, since the gas is supplied to the periphery of the reticle substrate R to form the wall of the gas and since the thinner solution is sprayed, it is not only possible to protect the surface of the reticle substrate R, but it is also possible to inhibit the volatilization of the solvent from the coating liquid in the coated region. Moreover, since the cooling means (not shown) provided on the plate 23 cools a region above the coated region of the reticle substrate R, it is possible to further prevent the volatilization of the solvent.

In addition thereto, since the cover body 44 is rotatable, vertically movable and retractable by means of the supporting substrate 41, it is possible to adopt a technique for previously supplying two lines of coating liquid to a coating region of the reticle substrate R as a previous step, and thereafter, for rotating the reticle substrate R by 90 degrees to apply the coating liquid between the two lines of coating liquid as an after step. According to such a coating technique, there is an advantage in that the shape of the coating film at the right and left ends is not disordered when the above described linear coating regions are arranged to form the coating film. In addition, since the cover body 44 can be moved upwards by one or two stages from the lower end position (lower stage), the stages can be chosen according to the status so as to use the lower stage during transportation, the middle stage at the previous step before the coating process, and the upper stage at the after step. Thus, for example, when the previous step is carried out, it is possible to prevent the cover body 44 from contacting the hanging wall, and when the after step requiring a longer time than the previous step is carried out, it is possible to cause the reticle substrate R to approach the plate 23 to the limit, to effectively protect the surface of the reticle substrate R and prevent the drying (volatilization of solvent) of the reticle substrate R.

Figure 16:
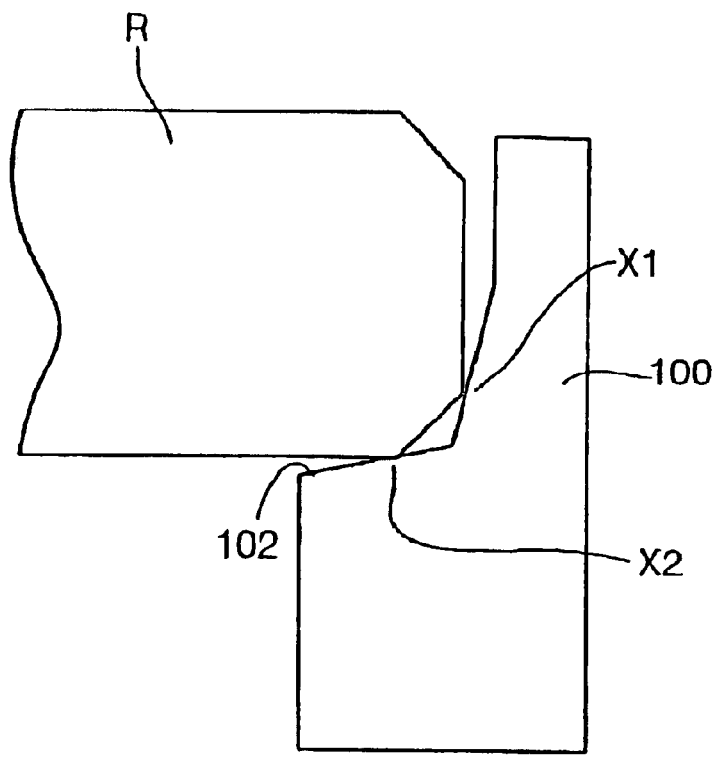
FIG. 16 is a longitudinal sectional view showing another preferred embodiment of a coating film forming system according to the present invention.
Figure 17:
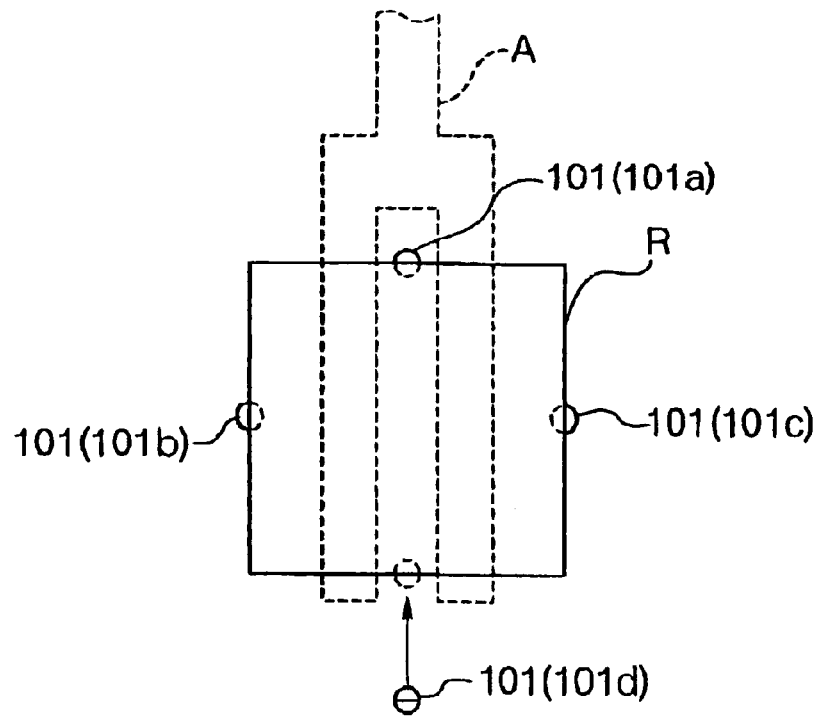
FIG. 17 is a plan view showing another preferred embodiment of a coating film forming system according to the present invention.
Figure 18:
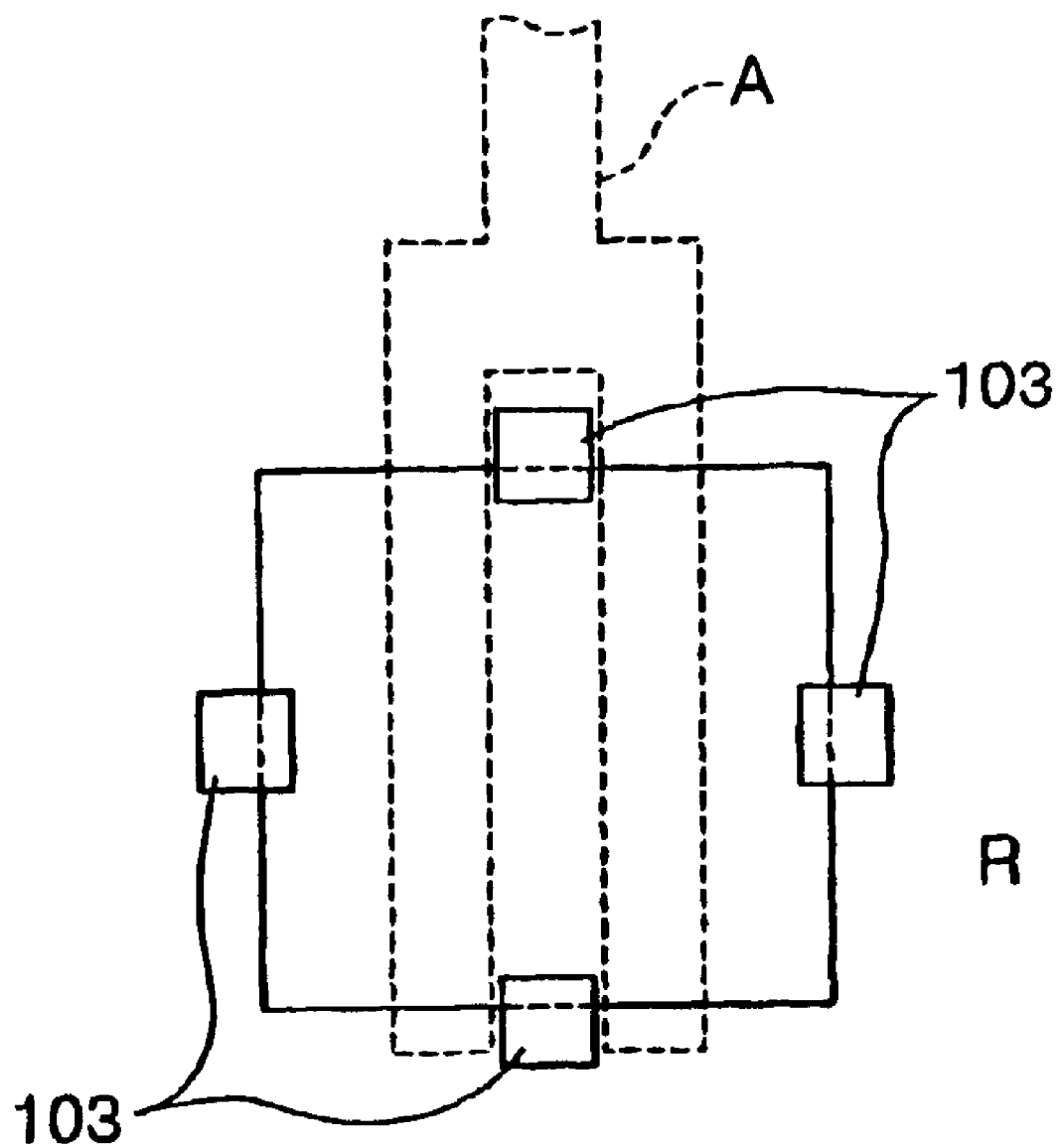
FIG. 18 is a plan view showing a further preferred embodiment of a coating film forming system according to the present invention.

Since the substrate holding portion 3 holds the reticle substrate R on the C surface, there are advantages in that it is possible to stably hold the reticle substrate R and it is difficult to produce particles. The method for holding the reticle substrate R in the substrate holding portion should not be limited to that in the above described preferred embodiment. Referring to FIGS. 16 through 18, other examples of holding methods will be described below.

In the above described first preferred embodiment, the suction port 64 has been provided above the plate 23 in the vicinity of the slit 27 as shown in FIG. 7. On the other hand, the suction port 64 may be provided above and below the plate 23 in the vicinity of the slit 27. Mist sucked into the suction port 64 includes mist produced when the coating liquid is discharged from the nozzle portion 6, mist produced by the collision of the coating liquid with the shutter 7, and mist rebounding from the reticle substrate R. The mist directly discharged from the nozzle portion 6 and the mist produced by the collision of the coating liquid with the shutter 7 mainly exist above the plate 23, and the mist produced by the collision of the coating liquid with the reticle substrate R mainly exists below the plate 23. By providing the suction ports 64 above and below the plate 23, it is possible to surely recover mist on both sides of the plate 23.

FIGS. 16 and 17 show the second preferred embodiment of a substrate holding portion according to the present invention. The substrate holding portion 100 shown herein is designed to hold the periphery of the reticle substrate R at four supporting pins 101. Each of the supporting pine 101 is designed to support the lower C surface of the reticle substrate R on a supporting surface 102 only at two points of corner portion X1 and X2 in a point contact state. The reticle substrate R carried in the housing 21 by the transfer arm A is first held at three places (three sides) as shown in FIG. 17 by the forward movement of the supporting pins 101 (101a, 101b, 101c) standing by on the side of the reticle substrate R. In this state, the supporting pin 101d pushes the remaining one side to substantially horizontally hold the reticle substrate R. According to this preferred embodiment, the reticle substrate R is supported by the supporting pins 101 in the point contact state, so that it is more difficult to produce particles than the first preferred embodiment. The plan view of FIG. 18 shows the third preferred embodiment of a substrate holding portion according to the present invention. In this preferred embodiment, a gripping portion 103 having a narrower width than that of the gripping portion 31 in the first preferred embodiment is substituted for the gripping portion 31. With this construction, it is possible to obtain the same effect as that of the second preferred embodiment.

While claims define that the nozzle portion supplies the coating liquid to the substrate via the slit, this should not be limited to a case where the nozzle portion supplies the coating liquid above the slit as described in the above described preferred embodiments. For example, the present invention includes a case where a discharge hole formed in the tip portion of the nozzle portion enters the slit to discharge the coating liquid in this state.

Figure 19:
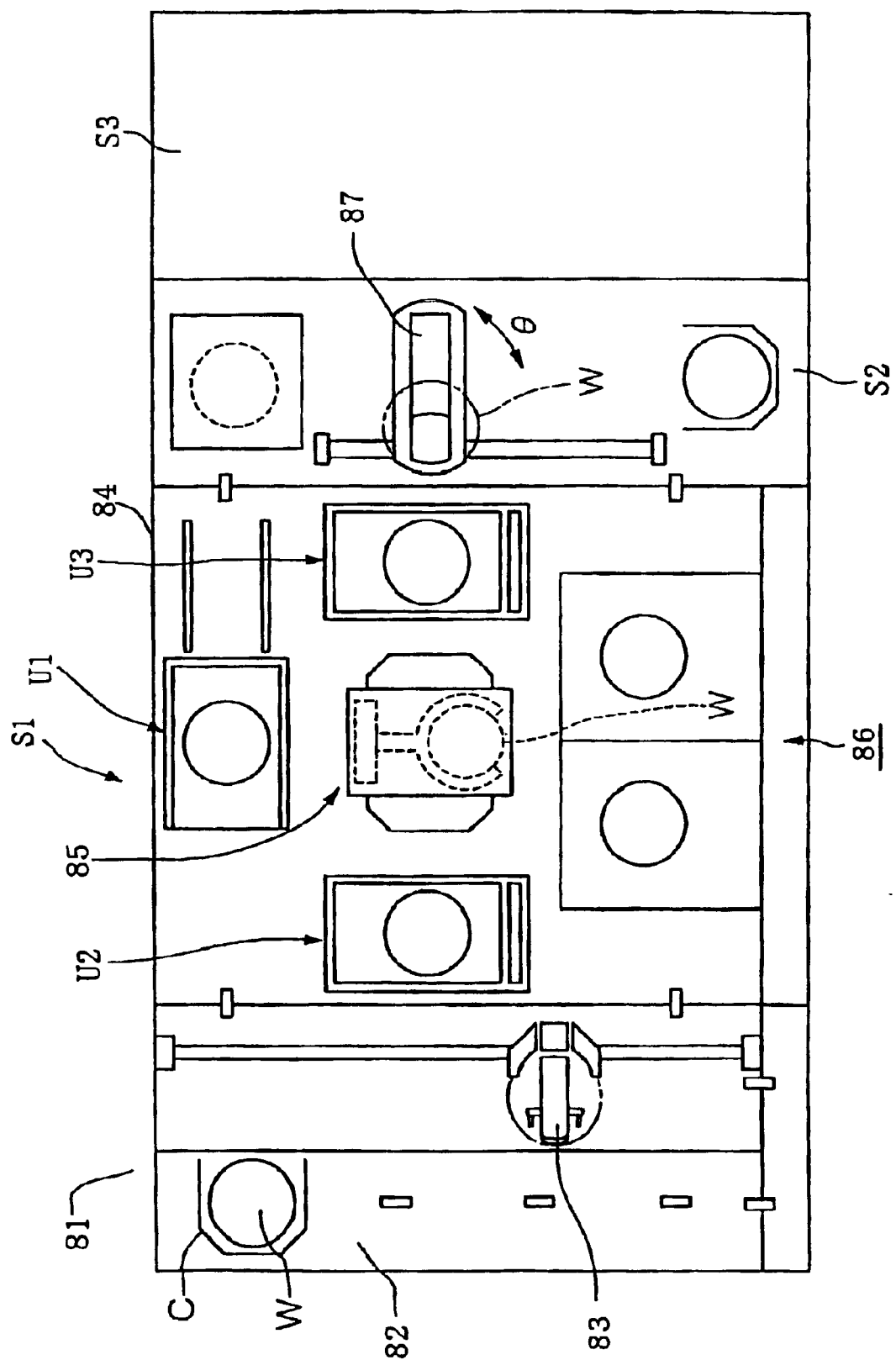
FIG. 19 is a plan view showing an example of a pattern forming system in which the coating film forming system is built.
Figure 20:
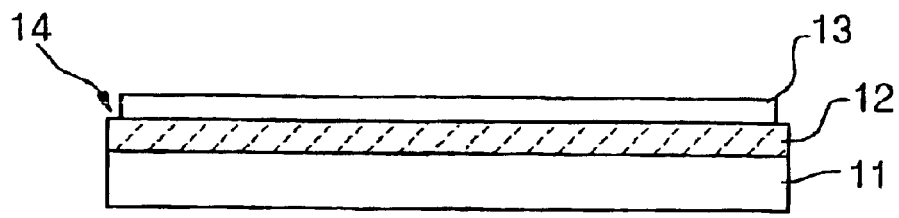
FIG. 20 is an illustration showing the state of a mask pattern formed on the surface of a reticle substrate.
Figure 21:
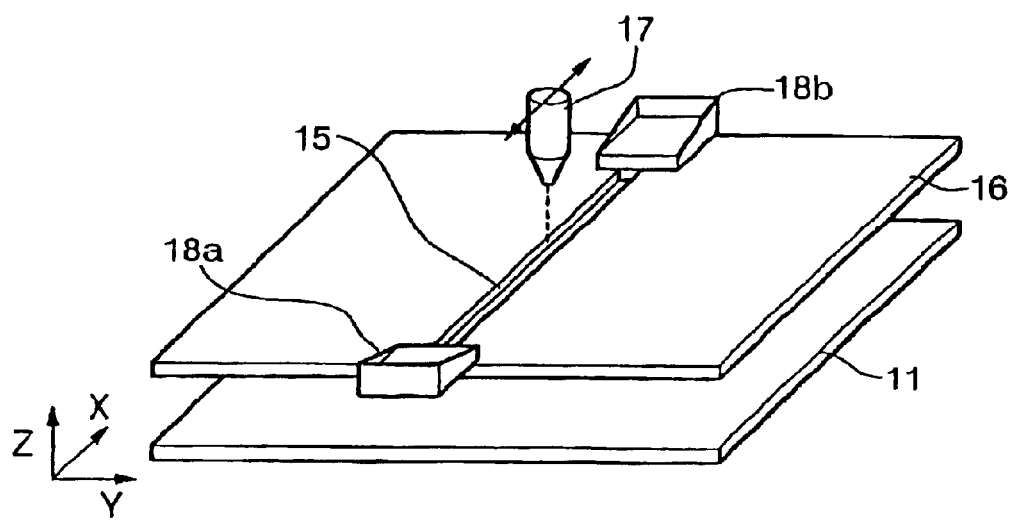
FIG. 21 is a schematic perspective view for explaining the construction of a conventional coating film forming system.
Figure 22:
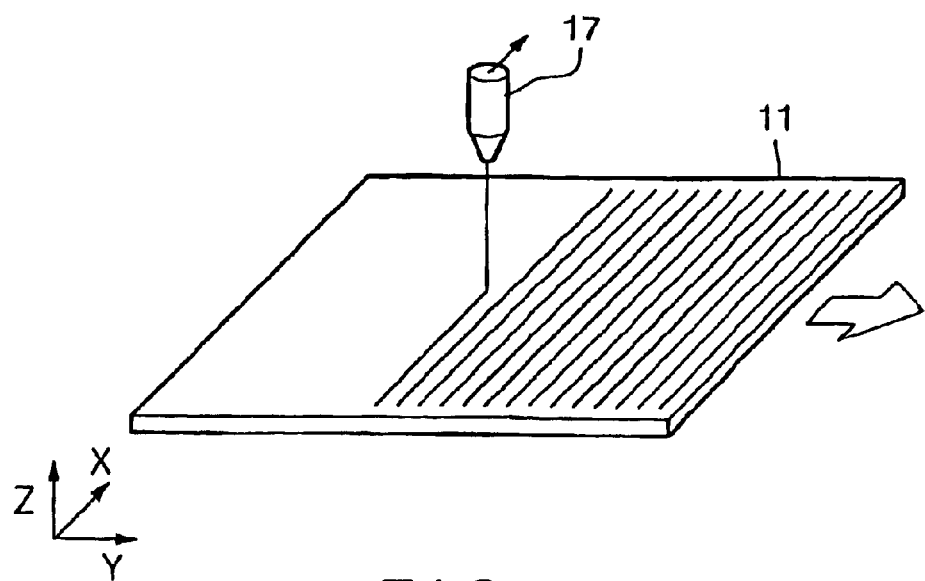
FIG. 22 is an illustration showing the operation of a conventional coating film forming system.

Referring to FIG. 19, a pattern forming system wherein the above described coating film forming system is built in a coating unit will be briefly described below. In the figure, reference number 81 denotes a cassette station which is provided with a cassette mounting portion 82 for mounting a cassette C housing therein, e.g., 25 wafers W, and a delivery means 83 for delivering the wafers W from and to the mounted cassette C. Inside of the delivery means 83, a processing section S1 surrounded by a housing 84 is connected thereto. At the center of the processing section S1, a main transfer means 85 is provided. Around the main transfer means 85, a liquid processing unit 86 comprising a coating/developing unit is provided on the right side viewed from the front side, and shelf units U1, U2 and U3 comprising heating/cooling units stacked in multi stages are arranged on the left side, front side and inside, respectively.

The shelf units U1, U2 and U3 comprise various combinations of units for carrying out previous and after treatments in the liquid processing unit 86, and include, e.g., a drying under reduced pressure unit, a heating unit, a cooling unit and so forth. Furthermore, the shelf units U2 and U3 include a delivery unit having a delivery table for delivering the wafers W. For example, the main transfer means 85 is movable in vertical and longitudinal directions and rotatable about a vertical axis, to be capable of delivering the wafers W between the respective units comprising the liquid processing unit 86 and shelf units U1, U2 and U3. Inside of the processing section S1, an exposure unit S3 is connected thereto via an interface unit S2. The interface unit S2 is designed to deliver the wafers W between the processing section S1 by the deliver means 87 which is movable in vertical, lateral and longitudinal directions and which is rotatable in a vertical axis.

As described above, according to the present invention, in a system for moving scanning a nozzle portion in lateral directions and moving a substrate in longitudinal directions to form a liquid film of a coating liquid on the surface of the substrate, it is possible to inhibit particles from adhering to the surface of the substrate. According to another invention, it is possible to improve the yields of the coating film formed on the surface of the substrate.

What is claimed is:

1. A coating film forming system comprising:
   a substrate holding portion configured to horizontally hold a substrate;
   a first driving part configured to move said substrate holding portion in longitudinal directions;

a nozzle portion configured to face said substrate held on said substrate holding portion and configured to discharge a coating liquid to said substrate;

a second driving part configured to move said nozzle portion in lateral directions;

a plate which has a slit being open so as to have a width configured to correspond to a lateral width of a coating region of said substrate and which is provided between said nozzle portion and said substrate; and a suction mechanism configured to suck a suspended matter over a range corresponding to said width of said slit via a suction port which is provided in the vicinity of said slit, wherein said nozzle portion is configured to move in said lateral directions to linearly apply said coating liquid in linear coating regions on said substrate via said slit, and thereafter, the system is configured to intermittently move said substrate to closely arrange said linear coating regions in said longitudinal directions, to form a coating film, and wherein front and rear edge portions of the slit are formed so as to have a longer length in vertical directions by bending said plate in an L shave downwards.

2. A coating film forming system as set forth in claim 1, wherein said suction port has a width configured to correspond to a movable range of said nozzle portion in said lateral directions.

3. A coating film forming system comprising:

a substrate holding portion configured to horizontally hold a substrate;

a first driving part configured to move said substrate holding portion in longitudinal directions;

a nozzle portion configured to face said substrate held on said substrate holding portion and configured to discharge a coating liquid to said substrate;

a second driving part configured to move said nozzle portion in lateral directions;

a plate which has a slit being open so as to have a width configured to correspond to a lateral width of a coating region of said substrate and which is provided between said nozzle portion and said substrate; and a shutter, provided on both ends of said slit, configured to receive said coating liquid from said nozzle portion; and a shock eliminating portion, provided on an end portion of a liquid receiving surface of said shutter on the side of said slit, configured to eliminate a shock of said coating liquid, first hitting on said shutter, to decrease an occurrence of mist, when said nozzle portion moves above said shutter beyond said coating region of said substrate, wherein said nozzle portion is configured to move in said lateral directions to linearly apply said coating liquid in linear coating regions on said substrate via said slit, and thereafter, the system is configured to intermittently move said substrate to closely arrange said linear coating regions in said longitudinal directions, to form a coating film.

4. A coating film forming system as set forth in claim 3, wherein said shock eliminating portion is formed so as to have an end portion facing in a lateral direction on the side of said slit on said liquid receiving surface and so as to protrude at an acute angle.

5. A coating film forming system as set forth in claim 3, wherein said shock eliminating portion has a porous structure, and is configured to have suction carried out through the shock eliminating portion.

6. A coating film forming system as set forth in claim 3, wherein said shutter is detachably mounted.

7. A coating film forming system as set forth in claim 3, wherein said liquid receiving surface of said shutter is inclined with respect to said substrate horizontally held by said substrate holding portion.

8. A coating film forming system as set forth in claim 7, wherein a solvent supply port configured to supply a solvent therethrough to wash said coating liquid adhering to said liquid receiving surface is formed in a region above said shock eliminating portion on said liquid receiving surface, and a suction port configured to suck said solvent therethrough is formed in a region below said shock eliminating portion on said liquid receiving surface.

9. A coating film forming system as set forth in claim 7, further comprising a suction mechanism configured to suck a suspended matter over a range corresponding to a lateral width of said shutter via a suction port which is provided in the vicinity of said liquid receiving surface so as to face said liquid receiving surface, wherein the system is configured to incline the liquid receiving surface of the shutter.

10. A coating film forming system comprising:

a housing which defines a space configured to process a substrate therein;

a substrate holding portion, provided in said housing, configured to horizontally hold said substrate;

a first driving part configured to move said substrate holding part in longitudinal directions;

a nozzle portion, provided in said housing and configured to face said substrate held on said substrate holding portion and configured to discharge a coating liquid to said substrate;

a second driving part configured to move said nozzle portion in lateral directions;

a filter unit configured to supply clean air into said housing;

a plate dividing the interior of said housing into an upper space including said filter unit and said nozzle portion, and a lower space including said substrate holding portion and said substrate held on said substrate holding portion;

a slit which is formed in said plate so as to have a width configured to correspond to a lateral width of a coating region of said substrate so that said coating liquid supplied from said nozzle portion is applied on said coating region of said substrate;

one or more vent holes, which are formed in said plate in a region other than a movable region of said substrate in said lower space when said plate is viewed from top, configured to flow air supplied from said filter unit into said lower space therethrough; and exhaust means for exhausting air from said lower space, wherein said nozzle portion is configured to move in said lateral directions to linearly apply said coating liquid in linear coating regions on said substrate via said slit, and thereafter, the system is configured to intermittently move said substrate to closely arrange said linear coating regions in said longitudinal directions, to form a coating film.

11. A coating film forming system as set forth in claim 10, wherein said movable region of said substrate includes a longitudinal movable region in which said substrate is configured to be moved by said first driving part, and a region through which said substrate is configured to pass when said substrate is carried in and out of said housing.

12. A coating film forming system as set forth in claim 10, wherein said exhaust means is configured to exhaust air via exhaust ports which are formed in bottom and side faces of said housing.

13. A coating film forming system as set forth in claim 10, further comprising:
   a suction mechanism configured to suck a suspended matter over a range corresponding to said width of said slit via a suction port which is provided above said plate in the vicinity of said slit.

14. A coating film forming system as set forth in claim 13, further comprising:
   a control part configured to control said filter unit, exhaust means and suction mechanism so that a flow rate of supply air in said filter unit is coincident with a total amount of a flow rate of exhaust air in said exhaust means and suction mechanism.

15. A coating film forming system as set forth in claim 1, wherein said suction mechanism has a buffer space configured to stabilize an air flow, inside of said suction port.

16. A coating film forming system as set forth in claim 1, wherein said suction mechanism has a straightening vane configured to stabilize an air flow, in said suction port or inside of said suction port.

17. A coating film forming system as set forth in claim 1, wherein said suction mechanism has a trap mechanism configured to recover a sucked suspended matter, in said suction port or inside of said suction port.

18. A coating film forming system as set forth in claim 1, wherein said suspended matter includes mist produced from said coating liquid.

19. A coating film forming system comprising:
   a substrate holding portion configured to horizontally hold a substrate;
   a first driving part configured to move the substrate holding portion in longitudinal directions;
   a nozzle portion configured to face the substrate held on the substrate holding portion and configured to discharge a coating liquid to the substrate;
   a second driving part configured to move the nozzle portion in lateral directions;
   a plate which has a slit being open so as to have a width configured to correspond to a lateral width of a coating region of the substrate and which is provided between the nozzle portion and the substrate so as to prevent the coating liquid from being applied outside of the coating region and so as to cover a movable region of the substrate on the front side of the slit;
   a volatilization protecting portion configured to surround a periphery of the substrate during a coating process
   a gas supply part configured to supply a gas into the volatilization protecting portion; and
   cooling means for cooling a lower surface of said plate, in a region surrounding the periphery of said substrate with said volatilization protecting portion,
   wherein the nozzle portion is configured to move in the lateral directions to linearly apply the coating liquid in linear coating regions on the substrate via the slit, and thereafter, the system is configured to intermittently move the substrate to closely arrange the linear coating regions in the longitudinal directions, to form a coating film.

20. A coating film forming system comprising;
   a substrate holding portion configured to horizontally hold a substrate;
   a first driving part configured to move the substrate holding portion in longitudinal directions;
   a nozzle portion configured to face the substrate held on the substrate holding portion and configured to discharge a coating liquid to the substrate;
   a second driving part configured to move the nozzle portion in lateral directions;
   a plate which has a slit being open so as to have a width configured to correspond to a lateral width of a coating region of the substrate and which is provided between the nozzle portion and the substrate so as to prevent the coating liquid from being applied outside of the coating region and so as to cover a movable region of the substrate on the front side of the slit;
   a volatilization protecting portion configured to surround a periphery of the substrate during a coating process; and
   a gas supply part configured to supply a gas into the volatilization protecting portion,
   wherein the nozzle portion is configured to move in the lateral directions to linearly apply the coating liquid in linear coating regions on the substrate via the slit, and thereafter, the system is configured to intermittently move the substrate to closely arrange the linear coating regions in the longitudinal directions, to form a coating film, and
   wherein said volatilization protecting portion comprises a cover body configured to surround a lower portion of said substrate and side portions of said substrate in said longitudinal directions and which is configured to be movable with said substrate holding portion, and a pair of hanging walls which are provided in front of said slit at a position, at which said hanging walls do not interfere with a movable region of said cover body, so as to sandwich a side of said movable region, said volatilization protecting portion configured to be moved to surround a coated region of said substrate by said plate, cover body and hanging walls.

21. A coating film forming system comprising:
   a substrate holding portion configured to horizontally hold a substrate;
   a first driving part configured to move the substrate holding portion in longitudinal directions;
   a nozzle portion configured to face the substrate held on the substrate holding portion and configured to discharge a coating liquid to the substrate;
   a second driving part configured to move the nozzle portion in lateral directions;
   a plate which has a slit being open so as to have a width configured to correspond to a lateral width of a coating region of the substrate and which is provided between the nozzle portion and the substrate so as to prevent the coating liquid from being applied outside of the coating region and so as to cover a movable region of the substrate on the front side of the slit;
   a volatilization protecting portion configured to surround a periphery of the substrate during a coating process; and
   a gas supply part configured to supply a gas into the volatilization protecting portion,
   wherein the nozzle portion is configured to move in the lateral directions to linearly apply the coating liquid in linear coating regions on the substrate via the slit, and thereafter, the system is configured to intermittently move the substrate to closely arrange the linear coating regions in the longitudinal directions, to form a coating film, and wherein said gas supply means is configured to supply a gas toward a reverse surface of said substrate to form a curtain of said gas around said substrate.

22. A coating film forming system as set forth in claim 20 or 21, wherein said cover body is configured to be rotatable, vertical movable and retractable integrally with said substrate and said substrate holding portion, said cover body configured to vary its height and direction in accordance with a status when said substrate is carried in and out, when said substrate is carried or when a coating process is carried out.

23. A coating film forming system as set forth in claim 20, wherein said gas supply means is configured to spray a same solvent as a solvent included in said coating liquid, with a gas.

24. A coating film forming system comprising:

a substrate holding portion configured to horizontally hold a substrate;

a first driving part configured to move the substrate holding portion in longitudinal directions;

a nozzle portion configured to face the substrate held on the substrate holding portion and configured to discharge a coating liquid to the substrate;

a second driving part configured to move the nozzle portion in lateral directions;

a plate which has a slit being open so as to have a width configured to correspond to a lateral width of a coating region of the substrate and which is provided between the nozzle port on and the substrate so as to prevent the coating liquid from being applied outside of the coating region and so as to cover a movable region of the substrate on the front side of the slit;

a volatilization protecting portion configured to surround a periphery of the substrate during a coating process; and a gas supply part configured to supply a gas into the volatilization protecting portion, wherein the nozzle portion is configured to move in the lateral directions to linearly apply the coating liquid in linear coating regions on the substrate via the slit, and thereafter, the system is configured to intermittently move the substrate to closely arrange the linear coating regions in the longitudinal directions, to form a coating film, and wherein front and rear edge portions of said slit are formed so as to have a longer length in vertical directions by bending said plate in an L shape downwards.

25. A coating film forming system as set forth in any one of claims 1, 3, 10, and 24, wherein a portion, in which said slit is formed, is detachably mounted on said plate.

26. A coating film forming system as set forth in claim 23 wherein said solvent is a thinner solution.

27. A coating film forming system as set forth in any one of claims 1, 3, 10 and 24, wherein the system is configured such that peripheral portions of a surface and reverse surface of said substrate are cut so that said substrate has inclined cut surfaces, and said substrate holding portion is configured to bold said cut surfaces on the sides of the surface and reverse surface by plane contact.

28. A coating film forming system as set forth in any one of claims 1, 3, 10 and 24, wherein the system is configured such that a peripheral portion of a reverse surface of said substrate is cut so that said substrate has an inclined cut surface, and said substrate holding portion is configured to hold said cut surface by point contact.

29. A coating film forming system as set forth in any one of claims 1, 3, 10 and 24, wherein a processing space configured to receive said substrate is surrounded by a housing, an interior of the housing is divided into said processing space and a housing area configured to house therein a piping and a wiring, the housing configured to be controlled such that a pressure in said housing area is a negative pressure lower than that in said processing space.

* * * * *